United States Patent
Cideciyan et al.

(10) Patent No.: US 9,548,760 B2
(45) Date of Patent: *Jan. 17, 2017

(54) TAPE HEADER FORMAT HAVING EFFICIENT AND ROBUST CODEWORD INTERLEAVE DESIGNATION (CWID) PROTECTION

(71) Applicant: International Business Machines Corporation, Armonk, NY (US)

(72) Inventors: Roy D. Cideciyan, Rueschlikon (CH);
Robert A. Hutchins, Tucson, AZ (US);
Thomas Mittelholzer, Zurich (CH);
Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,522

(22) Filed: May 30, 2015

(65) Prior Publication Data
US 2015/0261608 A1    Sep. 17, 2015

Related U.S. Application Data

(63) Continuation of application No. 14/010,387, filed on Aug. 26, 2013, now Pat. No. 9,064,541.

(51) Int. Cl.
*H03M 13/29* (2006.01)
*H03M 13/27* (2006.01)
(Continued)

(52) U.S. Cl.
CPC .......... *H03M 13/27* (2013.01); *G06F 11/1076* (2013.01); *G11B 20/1833* (2013.01);
(Continued)

(58) Field of Classification Search
CPC ............. G11B 20/1833; G11B 20/1866; G11B 20/1201; H04L 1/0071; H04L 1/0061; H03M 13/2707; H03M 13/27; H03M 13/29; H03M 13/2703; H03M 13/356; H03M 13/2909; H03M 13/2945; H03M 13/2948; G06F 3/0619; G06F 3/0682; G06F 11/1076
(Continued)

(56) References Cited

U.S. PATENT DOCUMENTS 6,631,485 B1    10/2003  Morley et al.
7,376,888 B2    5/2008   Jaquette et al.
(Continued)

OTHER PUBLICATIONS

Anonymous, "Expanded Sub Data Set for Magnetic Tape Recording," IP.com, Nov. 13, 2012, pp. 1-5.
Sankaranarayanan et al., "Performance of Product Codes on Channels with Memory," International Symposium on Information Theory, ISIT 2005 Proceedings, Sep. 4-9, 2005, pp. 548-552.
Notice of Allowance from U.S. Appl. No. 14/010,387, dated Feb. 17, 2015.
Cideciyan et al., U.S. Appl. No. 13/909,973, filed Jun. 4, 2013.
Cideciyan et al., U.S. Appl. No. 14/010,387, filed Aug. 26, 2013.
(Continued)

*Primary Examiner* — Cynthia Britt
(74) *Attorney, Agent, or Firm* — Zilka-Kotab, PC

(57) ABSTRACT

In one embodiment, a computer program product for providing header protection in magnetic tape recording includes a computer readable storage medium having program instructions embodied therewith, the program instructions readable by a processor to cause the processor to: calculate or obtain, by the processor, codeword interleave designation (CWID) parity for all CWIDs in a codeword interleave (CWI) set header, the CWID parity including error correction coding (ECC) parity, and store, by the processor, the CWID parity to a magnetic tape in one or more fields which are repeated for each CWI header in the CWI set header without using reserved bits in the CWI set header to store the CWID parity. Other systems and methods for providing header protection in magnetic tape recording are described in more embodiments.

20 Claims, 16 Drawing Sheets

(51) Int. Cl.
*G11B 20/18* (2006.01)
*H04L 1/00* (2006.01)
*H03M 13/35* (2006.01)
*G06F 11/10* (2006.01)
G06F 3/06 (2006.01)
H03M 5/00 (2006.01)
H03M 13/09 (2006.01)
H03M 13/15 (2006.01)

(52) U.S. Cl.
CPC ......... *G11B 20/1866* (2013.01); *H03M 13/29* (2013.01); *H03M 13/2909* (2013.01); *H03M 13/2945* (2013.01); *H03M 13/2948* (2013.01); *H03M 13/356* (2013.01); *H04L 1/0071* (2013.01); *G06F 3/0619* (2013.01); *G06F 3/0682* (2013.01); *H03M 5/00* (2013.01); *H03M 13/09* (2013.01); *H03M 13/1515* (2013.01); *H03M 13/2707* (2013.01); *H04L 1/0061* (2013.01)

(58) Field of Classification Search
USPC .......................... 714/701, 771, 784; 360/48
See application file for complete search history.

(56) References Cited

U.S. PATENT DOCUMENTS

| | | | |
|---|---|---|---|
| 8,139,304 | B2 | 3/2012 | Cideciyan et al. |
| 8,929,014 | B2 | 1/2015 | Cideciyan et al. |
| 9,064,541 | B2 | 6/2015 | Cideciyan et al. |
| 2011/0252290 | A1 | 10/2011 | Cideciyan et al. |
| 2012/0033321 | A1* | 2/2012 | Cideciyan ......... G11B 5/00817 360/48 |
| 2012/0058696 | A1 | 3/2012 | Whitman |
| 2012/0144271 | A1 | 6/2012 | Cideciyan et al. |
| 2012/0210194 | A1 | 8/2012 | Cideciyan et al. |
| 2014/0108881 | A1 | 4/2014 | Blaum et al. |
| 2014/0355151 | A1 | 12/2014 | Cideciyan et al. |
| 2014/0380118 | A1 | 12/2014 | Cideciyan et al. |
| 2015/0058696 | A1 | 2/2015 | Cideciyan et al. |

* cited by examiner

204 →

| Forward Sync | First CWI-4 | Resync | Second CWI-4 | Reverse Sync |

| Byte positions | Length in bytes | Name of the field |
|---|---|---|
| 0 | 6 | CWI-4 Identifier |
| 6 | 4 | Write Pass |
| 10 | 2 | Header Parity |

FIG. 2D

| Byte 0 (H0) | | | | | | | | Byte 1 (H1) | | | | | | | |
|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 |
| AF | AWT | | Data Set Id Fragment (DSIF) | | | | | ACN | | | | | | | |
| Byte 2 (H2) | | | | | | | | Byte 3 (H3) | | | | | | | |
| 7 | 6 | 5 | 4 | 3 | 2 | 1 | 0 | 7 | 6 | 5 | 4 | 3 | 2 | 1 | 0 |
| ACN (cont) | | | | | | | | CWI-4 Designation (CWID) | | | | | | | |
| Byte 4 (H4) | | | | | | | | Byte 5 (H5) | | | | | | | |
| 7 | 6 | 5 | 4 | 3 | 2 | 1 | 0 | 7 | 6 | 5 | 4 | 3 | 2 | 1 | 0 |
| Reserved Bits (RB) | | | | | | | | | | | | | | R | F |

FIG. 11

TAPE HEADER FORMAT HAVING EFFICIENT AND ROBUST CODEWORD INTERLEAVE DESIGNATION (CWID) PROTECTION

RELATED APPLICATIONS

This application is a continuation of U.S. patent application Ser. No. 14/010,387, filed Aug. 26, 2013, which is herein incorporated by reference.

BACKGROUND

The present invention relates to data storage, and more particularly, to a tape header format which provides efficient and robust codeword interleave designation (CWID) protection for use in a tape storage system.

In modern magnetic tape storage devices, data which is written on the tape is protected by one or more error correction code (ECC). For data correction, data which is read from the tape is conceptually arranged into a large matrix and is protected by two orthogonal error correcting codes, referred to typically as C1 and C2. The large data matrix is referred to as a sub data set (SDS). The C1 code is used to correct the rows of the SDS and the C2 code is used to correct the columns. This error correction methodology is very powerful. However, in order for this error correction methodology to work, the data has to be placed into the correct locations in the SDS. If the data's location cannot be determined, then the error correction methodology cannot be applied to this data. Therefore, the data location information is stored in a field called the header.

Hard-decision iterative C1/C2 decoding using error-only decoding significantly improves error rate performance over other conventional decoding methods. To obtain the best possible error-rate performance with hard-decision iterative C1/C2 decoding, it is important to place uncorrectable C1 errors (uncorrectables) at the correct locations in the data set stored to the buffer memory. Codeword interleave designations (CWIDs) stipulate the addresses of a number of byte-interleaved codeword interleaves (CWIs) within a data set. In one such approach, four byte-interleaved codeword interleaves (CWI-4s) are used. Successful decoding of CWIDs is required for correct placement of C1 uncorrectables in the data set. Therefore, strong error protection of the CWIDs is beneficial to ensuring proper placement of the C1 uncorrectables. However, most conventional methods of improving the CWID protection also reduce format efficiency by adding error correction overhead to the existing header format. Furthermore, conventional methods of providing CWID protection may also utilize bits in the tape headers that are reserved (such as for future use, expansion, etc.). This is undesirable.

BRIEF SUMMARY

In one embodiment, a computer program product for providing header protection in magnetic tape recording includes a computer readable storage medium having program instructions embodied therewith. The program instructions are readable by a processor to cause the processor to calculate or obtain, by the processor, codeword interleave designation (CWID) parity for all CWIDs in a codeword interleave (CWI) set header. The CWID parity includes error correction coding (ECC) parity. The program instructions are also readable to store, by the processor, the CWID parity to a magnetic tape in one or more fields which are repeated for each CWI header in the CWI set header without using reserved bits in the CWI set header to store the CWID parity.

According to another embodiment, a system for providing header protection in magnetic tape recording includes a processor and logic integrated with and/or executable by the processor. The logic is configured to calculate or obtain CWID parity for all CWIDs in a CWI set header. The CWID parity includes ECC parity. The logic is also configured to store the CWID parity to a magnetic tape in one or more fields which are repeated for each CWI header in the CWI set header without using reserved bits in the CWI set header to store the CWID parity.

In yet another embodiment, a method for providing header protection in magnetic tape recording includes calculating or obtaining CWID parity for all CWIDs in a CWI set header. The CWID parity includes ECC parity. The method also includes storing the CWID parity to a magnetic tape in one or more fields which are repeated for each CWI header in the CWI set header without using reserved bits in the CWI set header to store the CWID parity.

Other aspects and embodiments of the present invention will become apparent from the following detailed description, which, when taken in conjunction with the drawings, illustrates by way of example the principles of the invention.

BRIEF DESCRIPTION OF THE SEVERAL VIEWS OF THE DRAWINGS

FIGS. 2A-2D show various headers associated with a Codeword Interleave-4 (CWI-4).

FIG. 11 shows a CWI-4 header layout according to one embodiment.

DETAILED DESCRIPTION

Figure 1:
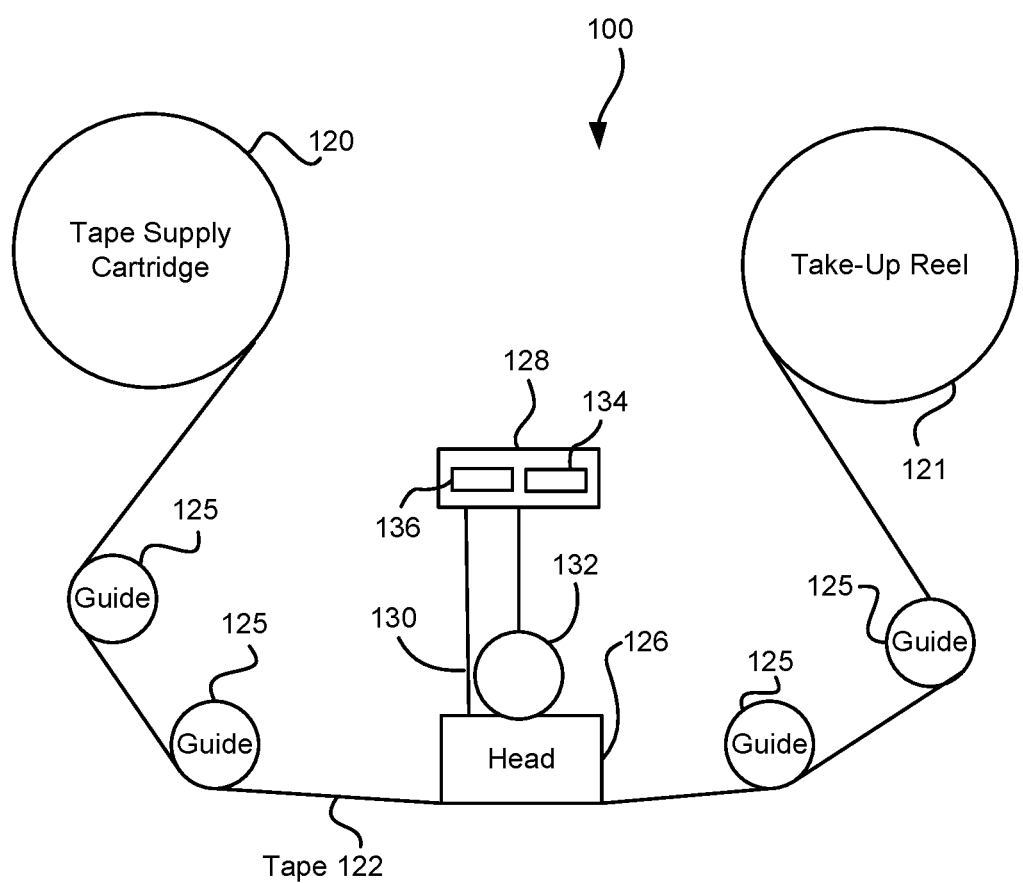
FIG. 1 illustrates a simplified tape drive of a tape-based data storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

In the prior art, a fundamental data block having four interleaved codewords therein written on each track is referred to as a Codeword Interleave-4 (CWI-4). "Codeword Interleave" refers to more than one (four in this case) Reed-Solomon (RS) codewords being interleaved when they are written onto magnetic tape. In one exemplary case, there are 234 bytes of data and 12 bytes of parity in a codeword. Each codeword may be used to correct up to six errors. In this exemplary case, the header is a 12-byte field that is placed at the beginning of four codewords. In order to protect the header, the header is broken into four interleaves of three bytes each. The parity for each RS codeword is calculated based upon the 234 bytes of data plus three header bytes, to form a RS(249,237) code. With this method, a certain number of errors in the header may be corrected. In prior generations of tape drives, this was not possible without using information from other CWI-4s.

In reality, the data location information, referred to as CWI-4 Designation (CWID) herein, is stored in just two bytes of the header. Each of these bytes is assigned to a different RS codeword interleave. If an error occurs in the header, and an uncorrectable error occurs in either of the RS codewords that contain the CWID bits, then the entire CWI-4 is lost. This is because it will not be possible to correctly place the data within the sub data set (SDS). Three codewords may be corrected so as to not contain any errors, but since the CWID bits have been lost, they cannot be correctly placed within the SDS, and therefore it does not matter if the codewords are correct or incorrect, they must be discarded.

Therefore, to obtain best possible error-rate performance with error-only C2 decoding and iterative hard-decision C1/C2 decoding, CWID parity may be calculated and placed across multiple tracks at header locations where the header fields do not change in a CWI set.

In one general embodiment, a system for providing header protection in magnetic tape recording includes a processor and logic integrated with and/or executable by the processor, the logic being adapted to write a codeword interleave (CWI) set on a magnetic tape, the CWI set including a plurality of CWIs being equal to a number of tracks on the magnetic tape, wherein a data set includes a plurality of CWI sets, provide a CWI set header for the CWI set, the CWI set header including a CWI header for each CWI in the CWI set, each CWI header including at least a CWI Designation (CWID) which indicates a location of the CWI within the data set, calculate or obtain CWID parity for all CWIDs in the CWI set header, the CWID parity including error correction coding (ECC) parity, and store the CWID parity to one or more fields which are repeated for each CWI header in the CWI set header without using reserved bits in the CWI set header to store the CWID parity.

According to another general embodiment, a method for providing header protection in magnetic tape recording includes writing a CWI set on a magnetic tape, the CWI set including a plurality of CWIs being equal to a number of tracks on the magnetic tape, wherein a data set includes a plurality of CWI sets, providing a CWI set header for the CWI set, the CWI set header including a CWI header for each CWI in the CWI set, each CWI header including at least a CWID which indicates a location of the CWI within the data set, calculating or obtaining CWID parity for all CWIDs in the CWI set header, the CWID parity including ECC parity, and storing the CWID parity to one or more fields which are repeated for each CWI header in the CWI set header without using reserved bits in the CWI set header to store the CWID parity, wherein each CWI header is 12 bytes in length (byte 0 to byte 11), and includes an amble flag (AF), an adjacent wrap toggle (AWT) field, and a data set identifier fragment (DSIF) stored in byte 0 (H0), an absolute codeword object set sequence number (ACN) stored in bytes 1 and 2 (H1 and H2), a CWID stored in bytes 2 and 3 (H2 and H3), reserved bits in bytes 4 and 5 (H4 and H5), a write pass identifier (WPI) stored in bytes 6, 7, 8, and 9 (H6, H7, H8, and H9), and header parity stored in bytes 10 and 11 (HA and HB).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a simplified tape drive 100 of a tape-based data storage system, which may be employed according to various embodiments. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 1) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

Error Correction Code (ECC) is used in data storage to achieve very low bit error rates, e.g., magnetic tape storage products are designed to ensure bit error rates in the range of $1 \times 10^{-17}$ to $1 \times 10^{-19}$ under normal operating conditions. Linear block codes, such as Reed-Solomon (RS) codes and low-density parity-check (LDPC) codes, have generally been preferred ECC schemes used in data storage products.

Figures 2A, 2B:
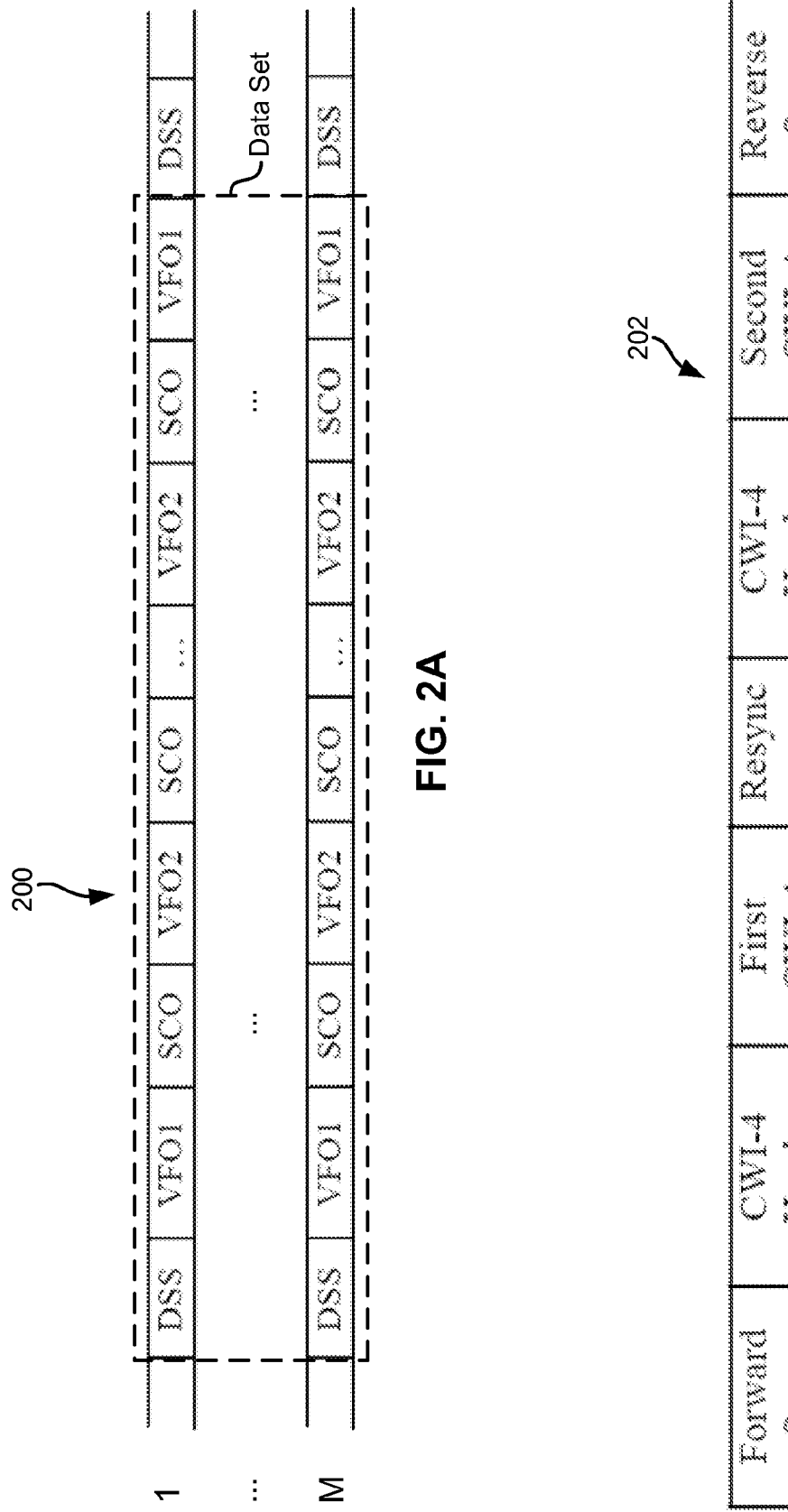

In FIG. 2A, a data set layout 200 having M tracks is shown where a sequence of synchronized codeword objects (SCO) are written in each track. Each data set starts with a data set separator (DSS) field and contains the various variable frequency oscillator fields (VFO1, VFO2) and SCO fields up to the next DSS field. FIG. 2B shows an SCO format 202 according to the prior art. In this layout, there are sixteen tracks (M=16), and a CWI-4 header is twelve bytes, with each codeword in a CWI-4 being 240 bytes, with 4 codewords being 960 bytes total. FIG. 2C shows another SCO format 204 according to the prior art. In this layout, there are thirty-two tracks (M=32) and the header is embedded in the CWI-4. Each codeword in a CWI-4 is 249 bytes, for a total for the four codewords in a CWI-4 of 996 bytes.

With reference to FIG. 2D, a 12-byte header 206 associated with a CWI-4 is shown in one embodiment. As shown, for bytes 0-11 (12 total bytes), the CWI-4 Identifier may be positioned at bytes 0-5 (6 bytes), the write pass at bytes 6-9 (4 bytes), and the header parity at bytes 10-11 (2 bytes). This is one embodiment of a layout for a CWI-4 header. Other possible byte distributions are also possible, as would be understood by one of skill in the art.

Figure 3:
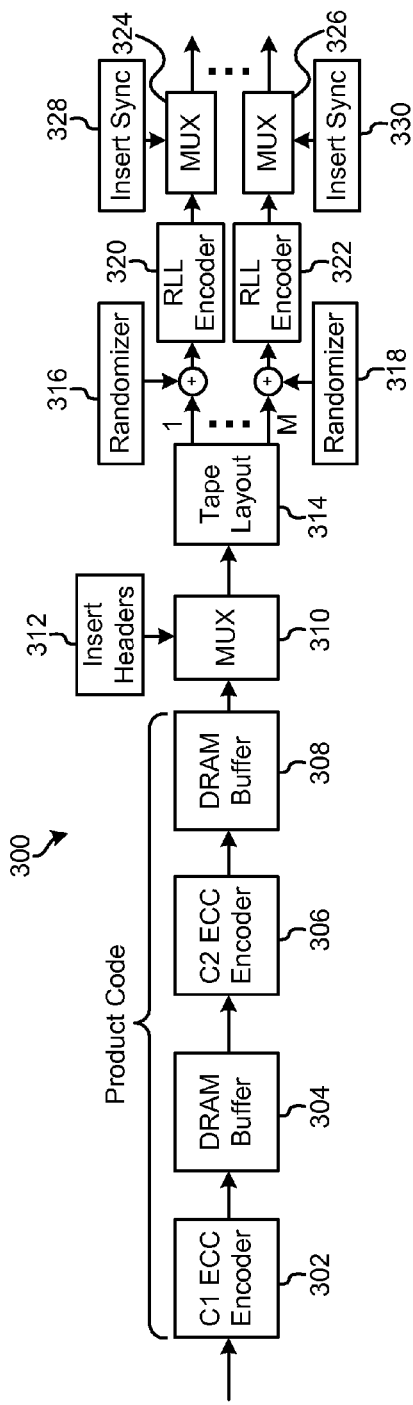
FIG. 3 shows a system for encoding data, according to one embodiment.

Now referring to FIG. 3, a system 300 for encoding data in a tape drive with M simultaneously written tracks is shown, including the operations of a C1 error correction code (ECC) encoder module 302, a DRAM buffer 304, C2 ECC encoder module 306, a second DRAM buffer 308 (which may be the same or different from DRAM buffer 304), a multiplexer 310 for adding headers 312 to encoded data, and tape layout addition module 314, according to one embodiment. The system 300 also includes scrambling (e.g., randomizers 1 to M adapted for data randomization in each channel) 316, . . . , 318, run-length limited (RLL) encoder modules 320, . . . , 322, individual channel multiplexers 324, . . . , 326 for inserting synchronization 328, . . . , 330 for each track 1, . . . , M. Any number of tracks may be written to a magnetic medium, such as 4 tracks, 8 tracks, 16 tracks, 32 tracks, 64 tracks, etc. Furthermore, any type of storage medium may be used, such as magnetic tape, optical disk (such as CD-ROM, DVD-ROM, Blu-Ray, etc.), hard disk, etc.

In one approach, the storage medium may be a magnetic tape, and the system 300 may comprise logic adapted for parsing the encoded data into a plurality of tracks prior to writing the encoded data to the magnetic tape, such as the tape layout addition module 314, in one embodiment.

In FIG. 3, the C1 ECC encoder module 302, the DRAM buffer 304, the C2 ECC encoder module 306, and the second DRAM buffer 308 may be used for inserting a product code into sub data sets (SDS).

In the following descriptions, most of these operations are not shown to simplify description as the C1 parity and C2 parity in the ECC encoding are the focus of the descriptions. However, any of the descriptions herein may include additional operations not depicted, but described in other figures.

Figure 4:
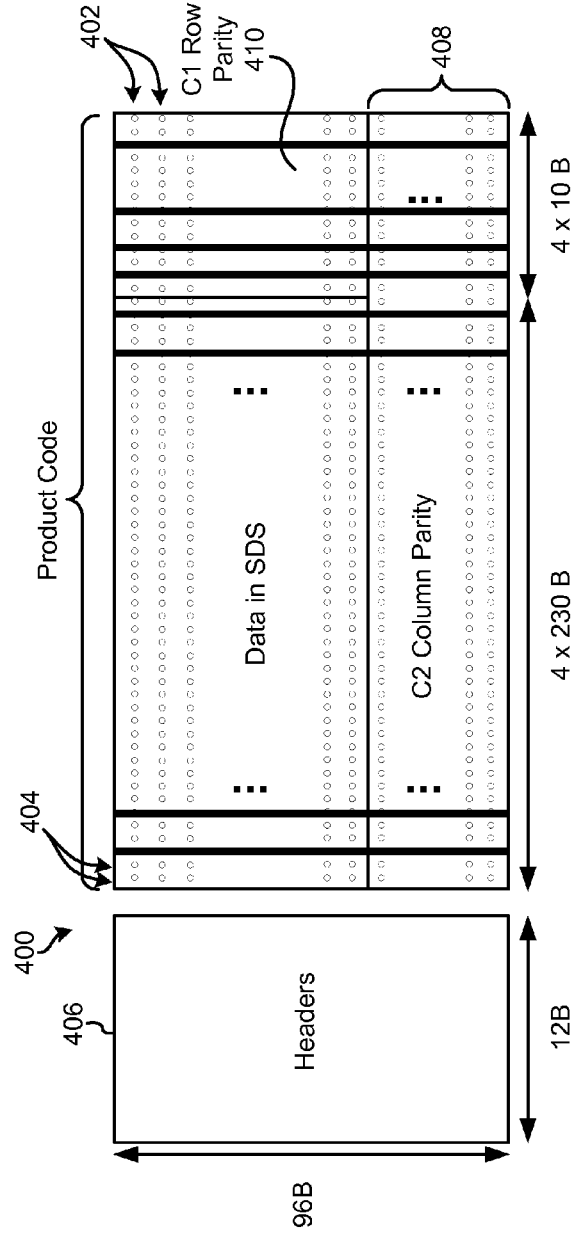
FIG. 4 shows an encoded sub data set (SDS) unit, according to one embodiment.

Each data set in the received data which is processed according to any embodiment described herein includes multiple subunits or SDS and each SDS is a two-dimensional array 400 shown in FIG. 4 with rows 402 and columns 404. Each row 402 in the array 400 comprises one or more C1 codewords, while each column 404 in the array 400 comprises one or more C2 codewords. In linear tape open (LTO), each encoded-SDS includes two (for generations LTO 1-LTO 4) or four (LTO 5 and later) C1 codewords in the rows 402. However, anywhere from one to eight or more C1 codewords may be included in each row 402 of the SDS array 400. Usually, hundreds or even thousands of headers 406 are assigned to a single data set because each data set includes multiple SDS and each row 402 of a column-encoded SDS is assigned a header (one row of the headers 406). FIG. 4 depicts 96 headers 406 that contain 12 bytes and are associated with the 96 rows 402 of the column-encoded SDS.

As shown in FIG. 4, since the C1 encoding takes place prior to the C2 ECC encoding, the C2 column parity 408 extends along the entire length of each row 402 in the C2 column parity portion of the array 400. The C1 row parity 410 is positioned at the end of each row 402 outside of the C2 column parity area 408 of the array 400. However, as indicated in FIG. 4 the dotted lines in the C2 column parity area 408 are C1 codewords. This is a property of the product code construction where the order of C1 and C2 extension may be interchanged without having an impact on the product code, i.e., all rows are from one code and all columns are from another code independent of the order of C1 and C2 extension. Therefore, the last 40 columns of the C2 column parity area 408 may be interpreted either as C1 parity or as C2 parity.

According to one embodiment, where each row 402 may include four C1 codewords interleaved into the entirety of the row 402, referred to as a CWI-4. Each C1 codeword may have 230 bytes of data, with the additional C1 parity adding an additional 10 bytes. Since four C1 codewords are interleaved in each row 402 in this embodiment, each row 402 (a row is one CWI-4) has 4×230 bytes+4×10 bytes=960 bytes. Furthermore, in this embodiment, there may be 96 rows 402 in each SDS array 400, or more or less rows 402 in other embodiments.

In addition, the headers 406, in one approach, may be 12 bytes long, with 96 rows 402 of headers 406 being present in this embodiment. This results in a total size of a SDS two-dimensional array 400 being 93,312 bytes, with no ECC encoding for the headers 406.

Furthermore, in one approach, the C1 ECC encoding scheme may comprise a RS(240,230,11) code over the Galois field GF(256), and the C2 ECC may comprise a RS(96,84,13) code over GF(256).

In more approaches, the length of a CWI-4 (984 bytes, each codeword being 246 bytes) and header (12 bytes) may be 996 bytes. In another approach, the length of a CWI-4 and header may be 1000 bytes, 1004 bytes, or some other value suitable for encoding the CWI-4 and header information with a desired level of protection.

Referring now to FIGS. 3-4, in one embodiment, a system 300 for encoding data may comprise logic adapted for receiving data comprising one or more SDS, a C1 ECC encoder module 302 adapted for generating a plurality of C1 codewords during C1 ECC encoding of the one or more SDS, each of the C1 codewords comprising a plurality of symbols. In some embodiments, the symbols may be bytes (8-bit symbols where the bits take values 0 or 1), although other symbols may be used in other embodiments. The system 300 may also include logic adapted for interleaving the plurality of C1 codewords into C1 codeword interleaves (CWIs), such as the multiplexer 310. Each CWI has a predetermined number of C1 codewords interleaved therein, and as shown in FIG. 4, there are four C1 codewords interleaved in each row (CWI-4) 402, but any number of codewords may be interleaved, such as two, six, eight, ten, etc.

In order to interleave C1 codewords into each row 402, what happens is that a first byte of each codeword is placed in the row, followed by the second byte of each codeword, followed by the third byte of each codeword, and each subsequent byte from each codeword interleaved together so that all codewords' first bytes are together, all second bytes, all third bytes, . . . , and then all last bytes of each of the codewords. In one embodiment, the positioning of the interleaves is different across different rows 402 in the array 400 so that the bits from the first interleave are not always in a column 404 together.

In other words, the logic adapted for interleaving the plurality of C1 codewords into the rows (CWIs) 402 comprises logic adapted for byte-interleaving a same number of C1 codewords together into each row (CWI) 402. The number of C1 codewords interleaved together may range from two to eight C1 codewords or more.

The tape layout interleaves C2 and C1 codewords and thus decorrelates byte errors at the C2 decoder input. In one approach, a 6 MB encoded data set (DS) may include 64 SDS which are the basic ECC data units each containing 96*996 bytes. The tape layout also associates headers to SDS rows (~1 kB packet) and assigns each packet to one of the logical tracks, e.g., to one of 32 logical tracks. An error rate of less than $1 \times 10^{-3}$ at the C2 decoder input translates to an error rate of less than $1 \times 10^{-17}$ at the C2 decoder output. A 32-track tape layout design has good decorrelation properties. An improved decorrelation due to a 50% increase over the LTO-5 minimum packet spacing is possible with embodiments described herein.

The system 300 also includes a C2 encoder module 306 adapted for generating a plurality of C2 codewords during C2 ECC encoding of the one or more SDS, each of the C2 codewords comprising a plurality of symbols. The C2 codewords are represented by columns 404 in the array 400, with each column 404 including a portion of one, exactly one, or more C2 codewords, according to various embodiments. However, in this embodiment, each C2 codeword has at most one symbol from each C1 codeword in each CWI (each row 402) and each column 404 is exactly one C2 codeword.

Also, the system 300 comprises logic adapted for writing the one or more encoded SDS to the storage medium. This logic may be included in the tape layout addition module 314, randomizers 316, 318, RLL encoders 320, 322, multiplexers 324, 326, and sync pattern insertion 328, 330, in one approach.

In system 300, the C1 ECC encoding is performed prior to the C2 ECC encoding, which results in SDS encoding as shown in FIG. 4, according to one embodiment.

Figure 5:
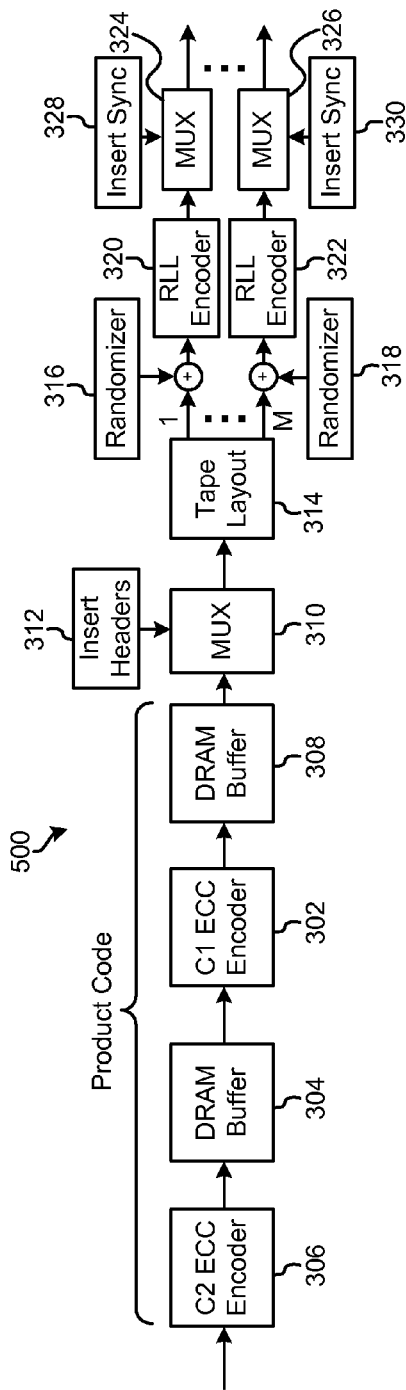
FIG. 5 shows a system for encoding data, according to one embodiment.
Figure 6:
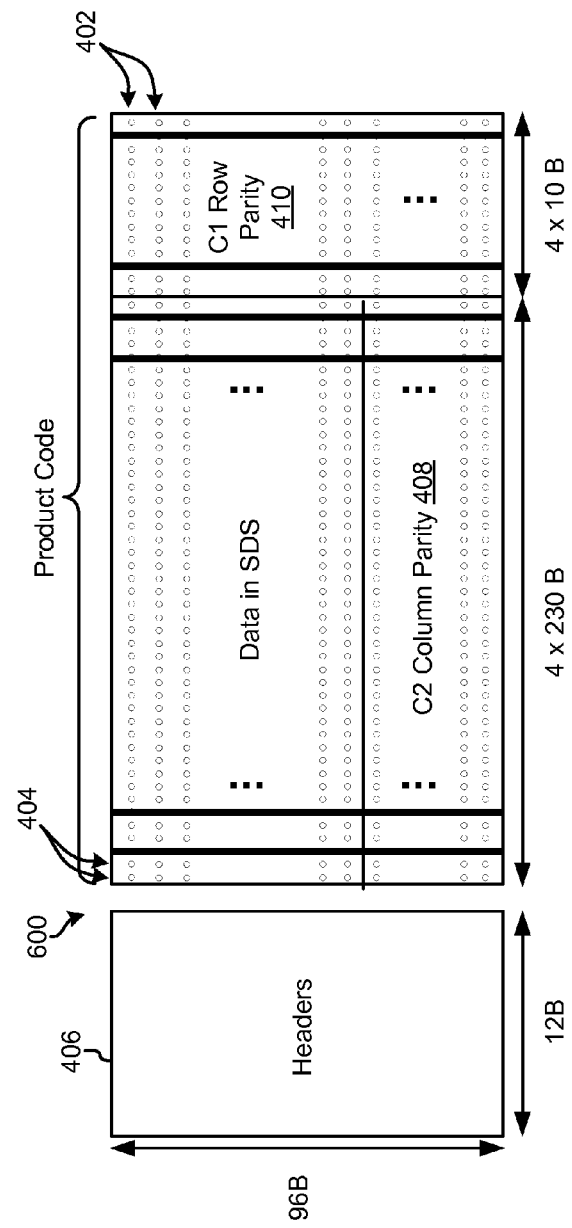
FIG. 6 shows an encoded SDS unit, according to one embodiment.

According to another embodiment, as shown in FIGS. 5-6, a system 500 may have the C2 ECC encoding (using the C2 ECC encoder module 306) performed prior to the C1 ECC encoding (using the C1 ECC encoder module 302), which results in SDS encoding as shown in FIG. 6, according to one embodiment. Although C2 encoding is performed first, the columns in the C1 row parity area 410 in FIG. 6 are C2 codewords indicated by solid vertical lines in the C1 row parity area 410. This is a property of product code construction.

However, just as in array 400 in FIG. 4, array 600 in FIG. 6 has headers 406 that are not encoded.

In this embodiment, it is possible to also have a C2 encoder module 306 adapted for generating a plurality of C2 codewords during C2 ECC encoding of the one or more SDS. The C2 codewords are represented by columns 404 in the array 600, with each column 404 including a portion of one, exactly one, or more C2 codewords, according to various embodiments. However, in this embodiment, each C2 codeword has at most one symbol from each C1 codeword in each CWI (each row 402) and each column 404 is exactly one C2 codeword.

Furthermore, in one approach, the C1 ECC encoding scheme may comprise a RS(240,230,11) code over GF(256), and the C2 ECC may comprise a RS(96,84,13) code over GF(256).

Figure 7:
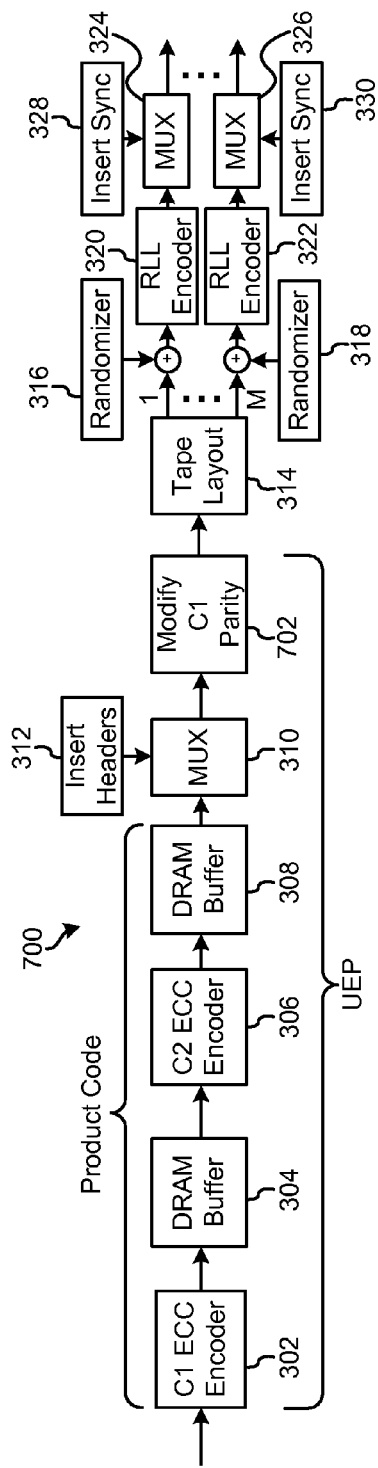
FIG. 7 shows a system for encoding data, according to one embodiment.
Figure 8:
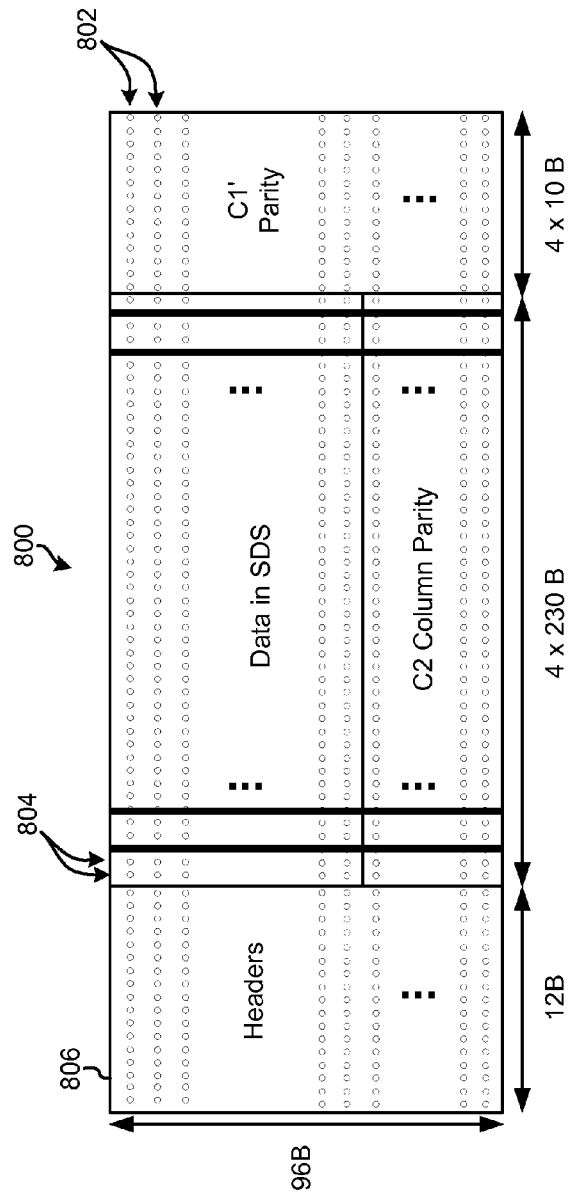
FIG. 8 shows an encoded SDS unit, according to one embodiment.

According to another embodiment, as shown in FIGS. 7-8, a system 700 may include all modules and logic that is present in FIG. 3, described previously. However, in the embodiment shown in FIGS. 7-8, the headers 806 of the array 800 may be encoded using a C1 encoding scheme by modifying the C1 row parity to account for the headers 806 using a C1 parity modifying module 702. This may be referred to as a concatenated code with unequal error protection (UEP). In this embodiment, the headers are protected by one-level ECC whereas the data is protected by two-level ECC.

In other words, the system 700 may also include logic adapted for adding a header 806 to each of the one or more SDS, and logic adapted for modifying the plurality of C1 codewords to account for inclusion of the headers.

In this embodiment, each header 806 includes encoding, which adds 12 bytes to each of the CWI. When four codewords are included in each row 802, 3 bytes are added to each of the four C1 codewords in a CWI.

However, just as in the previous embodiments, each C2 codeword has at most one symbol from each C1 codeword in each CWI (each row 802) and each column 804 is exactly one C2 codeword.

Figure 9:
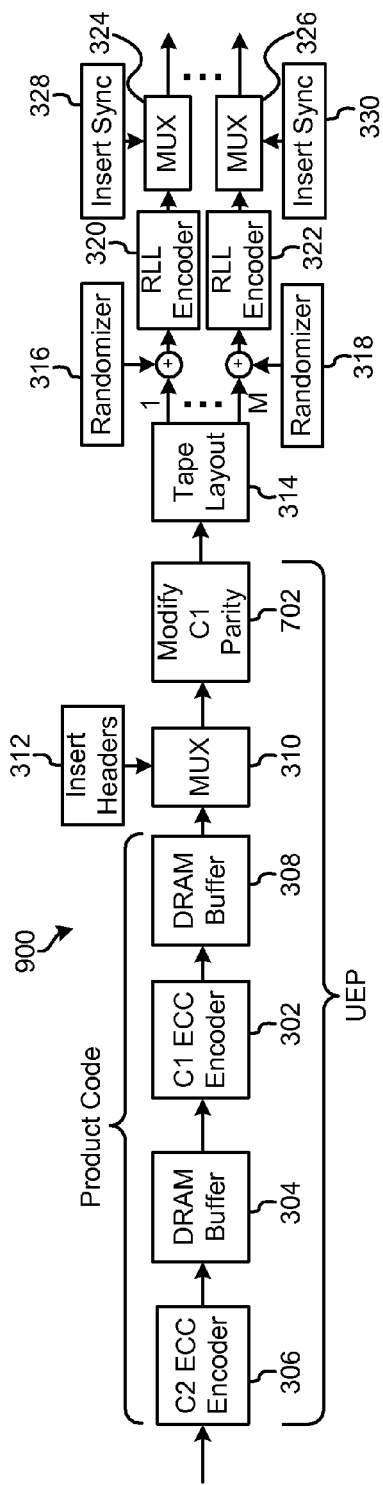
FIG. 9 shows a system for encoding data, according to one embodiment.
Figure 10:
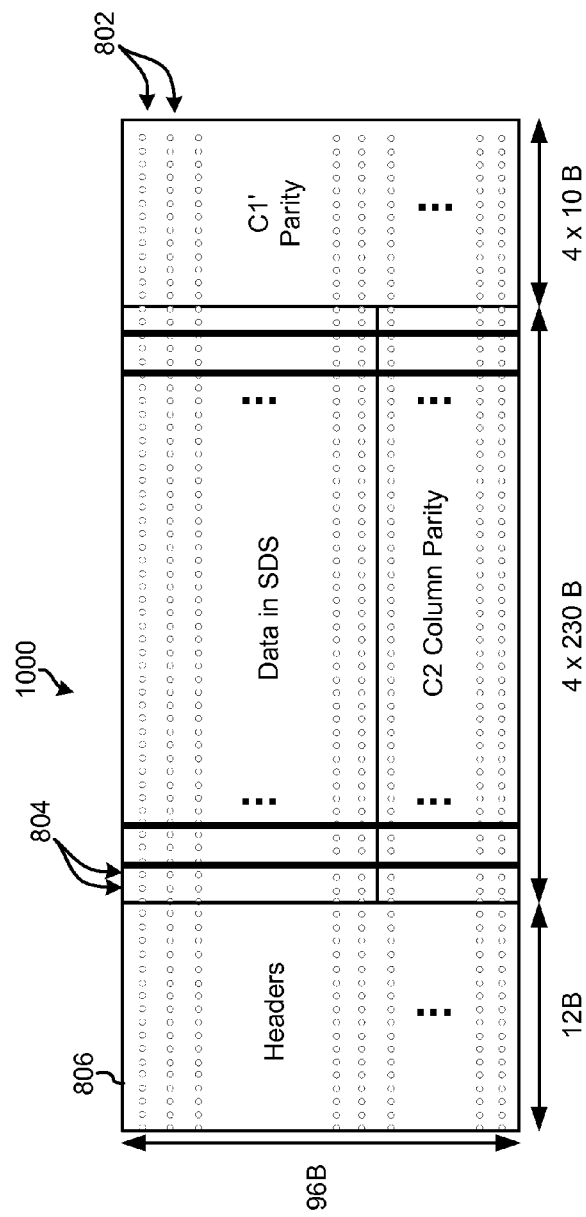
FIG. 10 shows an encoded SDS unit, according to one embodiment.

Now referring to FIGS. 9-10, a system 900 may include all modules and logic that is present in FIG. 5, described previously. However, in the embodiment shown in FIGS. 9-10, the headers 806 may be encoded using a C1 encoding scheme by modifying the C1 row parity to account for the headers 806 using a C1 parity modifying module 702. This may be referred to as a concatenated code with UEP. In this embodiment, the headers are protected by one-level ECC whereas the data is protected by two-level ECC.

In other words, the system 900 may also include logic adapted for adding headers 806 to each of the one or more SDS, and logic adapted for modifying the plurality of C1 codewords to account for inclusion of the headers.

In this embodiment, the C2 column parity do not extend across the entirety of the array 1000, as the modified C1 row parity exists in each row 802 of the array 1000. Furthermore, each header 806 includes encoding, which adds 12 bytes to each of the CWI. When four codewords are included in each row 802, 3 bytes are added to each of the C1 codewords.

However, just as in the previous embodiments, each C2 codeword has at most one symbol from each C1 codeword in each CWI (each row 802) and each column 804 is exactly one C2 codeword.

Now referring to FIG. 11, a CWI-4 header layout 1100 is shown according to one embodiment, assuming 32 channels (tracks). Other numbers of channels are also possible, such as 8 channels, 16 channels, 64 channels, etc. The CWI-4 header layout 1100 includes many different fields. Each field is described separately below, according to various embodiments. The CWI-4 header layout 1100 shown is not the only possible layout for a CWI-4 header, and the techniques, systems, and methods described herein may apply to other CWI-4 header layouts not specifically shown.

In the CWI-4 header 1100, the Amble Flag (AF) is used to indicate whether the CWI-4 is an Amble CWI-4 or a Data CWI-4, and is included in Byte 0 (H0). In one approach, the AF may be set to ONE if the CWI-4 is an Amble CWI-4, and ZERO if the CWI-4 is a Data CWI-4. When the last CWI-4 set of a data set is written to tape, there may not be any subsequent data sets ready to be written to tape. Due to the requirements of the read-while-write latency, the writing device cannot determine that the data set is complete until the last CWI-4 set has been verified. In the interval between writing the last CWI-4 set and it being verified on the tape, more CWI-4 sets must be written. In this case, the writing drive may perform either of the following: 1) repeat CWI-4 sets from the end of the last data set until it has verified that there is a good copy of every CWI-4 in the data set, or 2) write Amble CWI-4 sets until the verification is complete. All CWI-4s in an Amble CWI-4 set are Amble CWI-4s. Amble and Data CWI-4s are not mixed within a CWI-4 set typically. All AF fields (1-bit field) within a single CWI-4 set to be written are the same, e.g., all 32 AF fields for a 32 track writer are the same.

The Adjacent Wrap Toggle (AWT) field is used to indicate which wrap the CWI-4 is used for, and is also included in Byte 0 (H0). The AWT may be set to the second least significant bit of the wrap number, e.g., ZERO for wraps 0, 1, 4, 5, etc., and ONE for wraps 2, 3, 6, 7, etc. All AWT fields (1-bit field) within a single CWI-4 set to be written are the same, e.g., all 32 AWT fields for a 32 track writer are the same.

The Data Set ID Fragment (DSIF) field contains the six least significant bits of the data set number, and is also included in Byte 0 (H0). All DSIF fields (6-bit field) within a single CWI-4 set to be written are the same, e.g., all 32 DSIF fields for a 32 track writer are the same.

The Absolute Codeword Object Set Sequence Number (ACN) of a Codeword Object Set is one greater than the ACN of the Codeword Object Set written immediately before it on tape, or is ZERO if the previously written 11-bit ACN is 2047. The ACN is included in Byte 1 (H1) and Byte 2 (H2). The ACN is the same in all CWI-4 headers in the Codeword Object Set. ACN is e.g., used for debugging, for failure analysis, etc. All ACN fields (11-bit field) within a single CWI-4 set to be written are the same, e.g., all 32 ACN fields for a 32 track writer are the same.

The CWI-4 Designation (CWID) field indicates the location of a CWI-4 within a data set, and is included in Byte 2 (H2) and Byte 3 (H3). The order of first-written CWIDs within a CWI-4 set are known during reading. Therefore, header interpolation during reading may be used to recover erroneous CWI-4 Designations.

According to another CWI-4 rewrite scheme, the order of re-written CWIDs within a CWI-4 set are not known during reading. Therefore, header interpolation cannot be used to decode CWI-4 Designations of rewritten CWI-4s. Therefore, a header format with improved protection of CWID would be beneficial.

In various tape formats, the size of the CWID may vary. For example, in some tape formats, the CWID may be 12-bits in length, in other formats it may be 13-bits in length. Of course, other lengths are also possible, and may be accounted for in the other structures and schemes described herein. For example, the size of the CWID is likely to increase in future generations of tape drives, and the embodiments described herein may be altered to account for this increased CWID size.

The Reserved Bits (RB) field is reserved for future use and expansion, and may be set to ZEROs (to reserve it for future use). The RB is included in Byte 4 (H4) and Byte 5 (H5). All RB fields (15-bit field) within a single CWI-4 set to be written are the same.

The Rewritten Flag (RF) is included in Byte 5 (H5) and is used to indicate whether the CWI-4 is rewritten or not, and may be set to ZERO for the first written instance of the CWI-4 in the data set. If the CWI-4 is rewritten for any reason, for example if an error is detected during read-while-write, this flag is set to ONE in each rewritten instance of the CWI-4. This flag is ignored on interchange. All RF fields (1-bit field) within a single CWI-4 set to be written are the same.

The Write Pass Identifier (WPI) field, which is not shown in FIG. 11 may be included in 4 bytes (Bytes 6-9: H6, H7, H8 and H9). The WPI corresponds to the write pass on which the data set was written. The content of this field is the same as the Tape Write Pass value in the Data Set Information Table (DSIT) for the data set to which the CWI-4s belong, except following an interrupted data set. DSIT is a particular CWI-4 in a data set. The payload of the DSIT describes the content of the data set. All WPIs for a single CWI-4 set that is to be written are the same across all tracks (e.g., all 32 tracks record the same WPI for each CWI-4) under normal operating conditions.

The Header Parity field, also not shown in FIG. 11 is included in 2 bytes (Bytes 10-11: HA and HB). The Header Parity field is generated using a RS code. The 2-byte header parity is used to detect errors that have occurred when the 12-byte headers are read.

Figure 12:
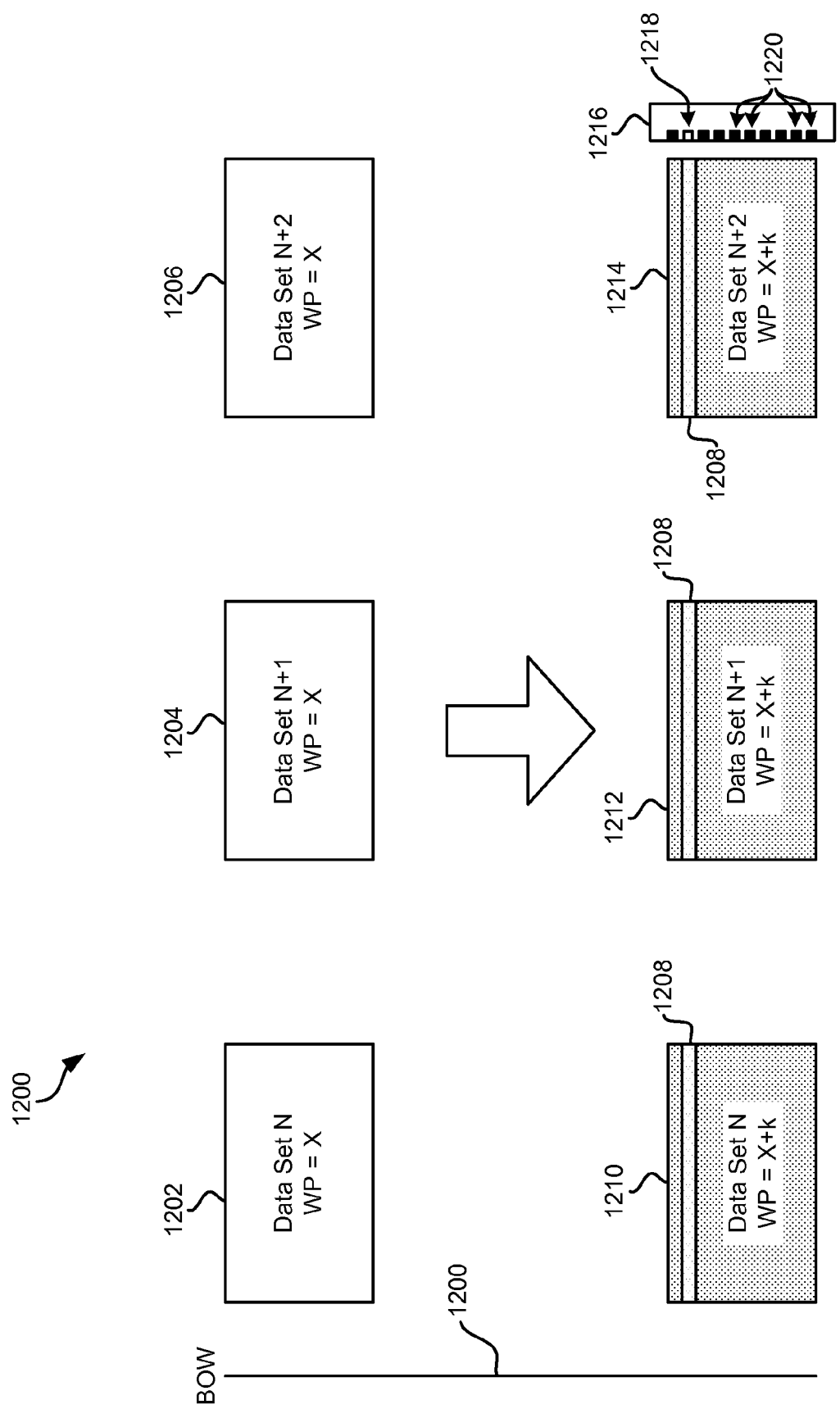
FIG. 12 shows importance of the write pass identifier (WPI), according to one embodiment.

Now referring to FIG. 12, the importance of the WPI is described in one approach. In FIG. 12, a situation 1200 is shown where a tape has data stored thereon as data set N 1202, data set N+1 1204, and data set N+2 1206. The write pass (WP) is indicated as X for the data as it was previously written. Each time the tape returns to the beginning of wrap (BOW), the WP is incremented by one, and this will be reflected in the WPI for each stored data set. This data is then rewritten to the tape as data set N 1210, data set N+1 1212, and data set N+2 1214 during WP X+k (where k is greater than or equal to 1), but something happens where at least one of the tracks is not written correctly such that the previously written track 1208 from WP X is preserved. This may be due to one of the writers 1220 of the write head 1216 being defective or otherwise not writing over the previously recorded data, such as writer 1218.

In the situation 1200 shown in FIG. 12, because all WPI fields (32-bits each) for each track (32 total tracks in one embodiment) within a CWI-4 set are not necessarily the same during readback of the data stored to the tape (WPI for track 1208 would be related to WP X, not WP X+k like all the other tracks in data set N 1210, data set N+1 1212, and data set N+2 1214) it can be determined that an error has occurred. This happens when errors occur during the read process because previously-recorded data for WP X is read instead of the newly written data for WP X+k. Previously-recorded data associated with a defective writer may be detected by reading the WPI, and when previously-recorded data is detected, the previously-recorded data is not sent to the memory buffer because it is known to be incorrect.

Figure 13:
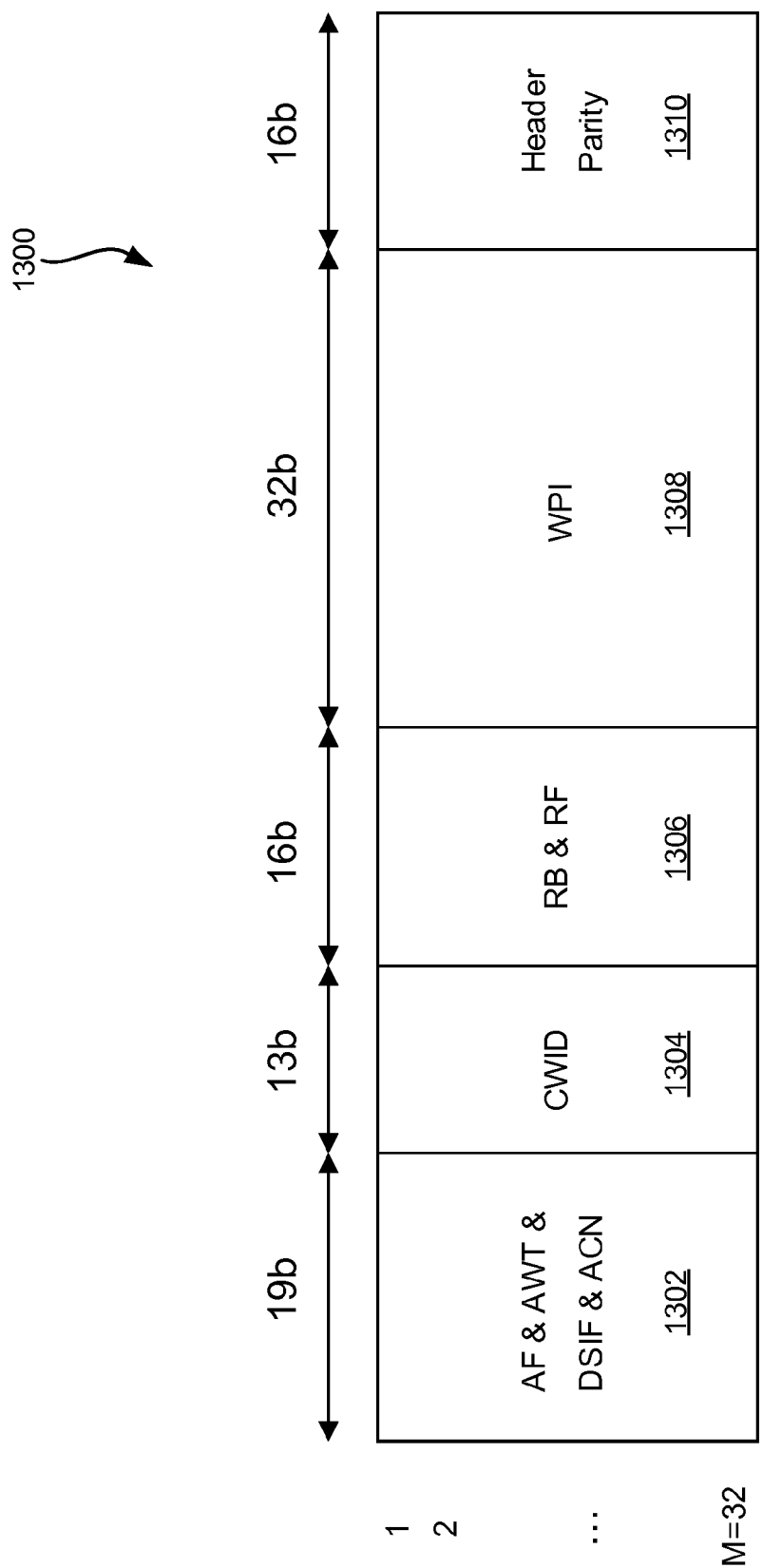
FIG. 13 shows a header format, according to one embodiment.

FIG. 13 shows a header format 1300 according to one embodiment. In this header format 1300, there are 32 headers for each CWI-4 set, one header for each track. The rows (CWI-4 headers) in FIG. 13 are adjacent to each other only for illustrative purposes. In current tape technology, two headerized CWI-4s in a CWI-4 set are simultaneously written on two physical tracks on tape that are not adjacent to each other, i.e., several CWI-4 sets on tape are spatially interleaved. Included in each header in the header format 1300 are 13-bit (13b) CWID fields 1304 and 16-bit (16b) header parity fields 1310 which are stored within the CWI-4 set, and change for each track within the CWI-4 set. Each 16-bit (16b) RB and RF fields 1306 are the same within the CWI-4 set but are not suitable for storing header parity associated with the CWID field 1304 because RB fields are reserved for future use and RF fields are ignored on interchange. Furthermore, 32-bit (32b) WPI fields 1308 are the same within the CWI-4 set but are also not suitable for storing header parity associated with the CWID field 1304 because the WPI field 1308 is used to avoid sending previously-recorded data to the memory buffer when a defective writer is detected, as described in FIG. 12.

Referring again to FIG. 13, the 19-bit (19b) AF, AWT, DSIF, and ACN fields 1302 are always the same within the CWI-4 set and are therefore repeated across the CWI-4 set. This makes these fields 1302 suitable for storing header parity associated with the CWID field 1304. It is in these fields that the header parity for the CWID field 1304 is stored, according to various embodiments described herein.

Figure 14:
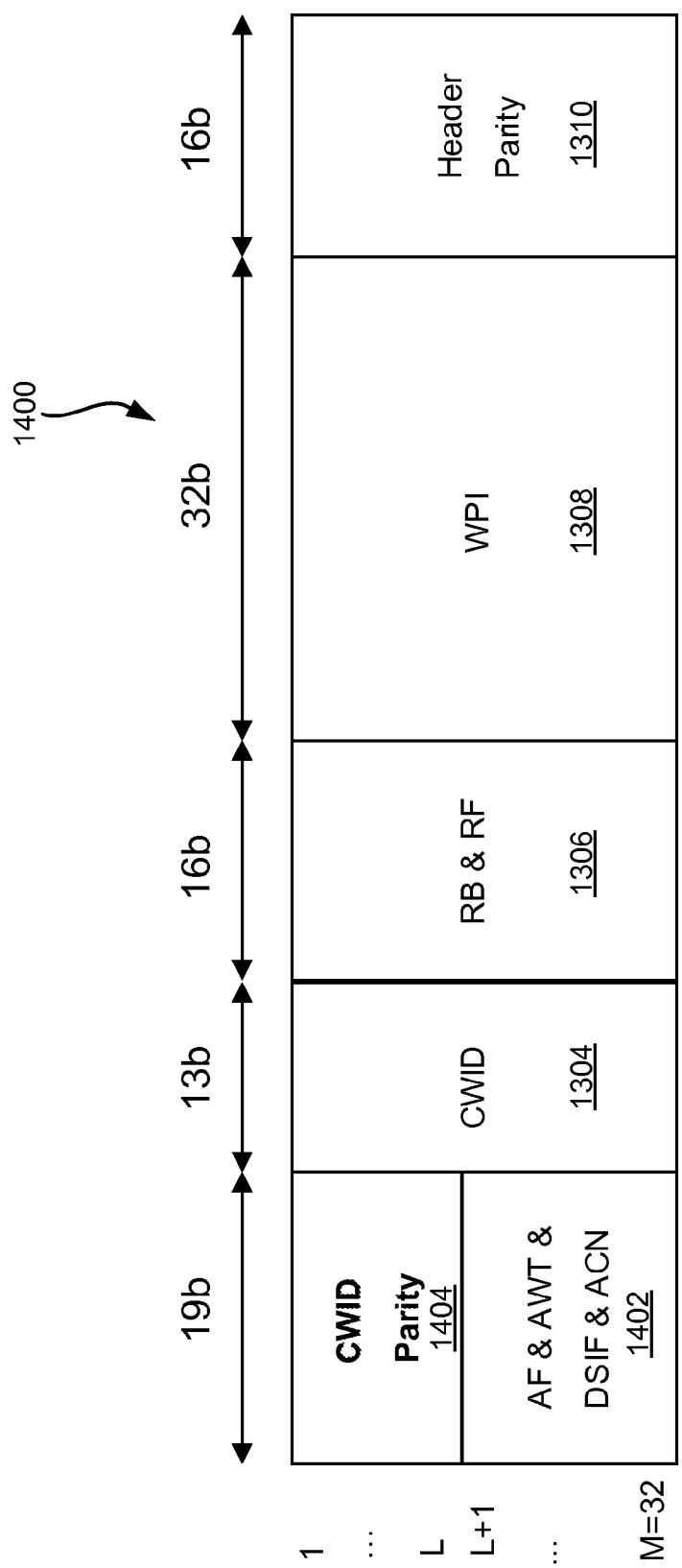
FIG. 14 shows a header format including codeword interleave designation (CWID) parity, according to one embodiment.

With reference to FIG. 14, a header format 1400 which allows for CWID parity 1404 placement is shown according to one embodiment. Some fields in the header format 1400 are unchanged from the header format 1300 shown in FIG. 13, including the CWID field 1304, RB and RF fields 1306, WPI field 1308, and header parity field 1310.

However, as shown in FIG. 14, the header format 1400 has utilized some of the bits in the AF, AWT, DSIF, and ACN fields 1402 in order to store the CWID parity 1404 therein. The CWID parity 1404 is shown stored in a block taking up tracks 1 to L, with the duplicated AF, AWT, DSIF, and ACN fields 1402 taking up tracks L+1 to M, where M may be any number of tracks (in this case it is shown to be 32, but may be more or less). This means that there are M headers in a CWI-4 set, with L tracks (L<M) storing CWID parity 1404 and M−L tracks storing the AF, AWT, DSIF, and ACN fields 1402. Since the AF, AWT, DSIF, and ACN fields 1402 are duplicated for each track, there is more than enough repeated fields to ensure that the correct information may be decoded, unless some catastrophic reading or writing error occurs.

In a first case, L=16 and M−L=16 such that CWID parity 1404 is stored on 19 bits×16 tracks=304 bits. In a second case, L=12 and M−L=20 such that CWID parity 1404 is stored on 19 bits×12 tracks=228 bits. Of course, L may be greater or less, such as 10, 14, 18, etc.

Although the CWID parity 1404 is shown as a block, it may be stored in tracks distributed across some or all of the CWI-4 set, evenly distributed, randomly distributed, split into two groups, three groups, four groups, etc., in any manner which helps to decode and place the information with more accuracy. That is to say the tracks of CWID parity 1404 do not have to be adjacent, instead, they may be located in any order within the group of M tracks. Furthermore, cross-track header interpolation based on a single group of M−L tracks provides best performance, in one approach.

Figure 15:
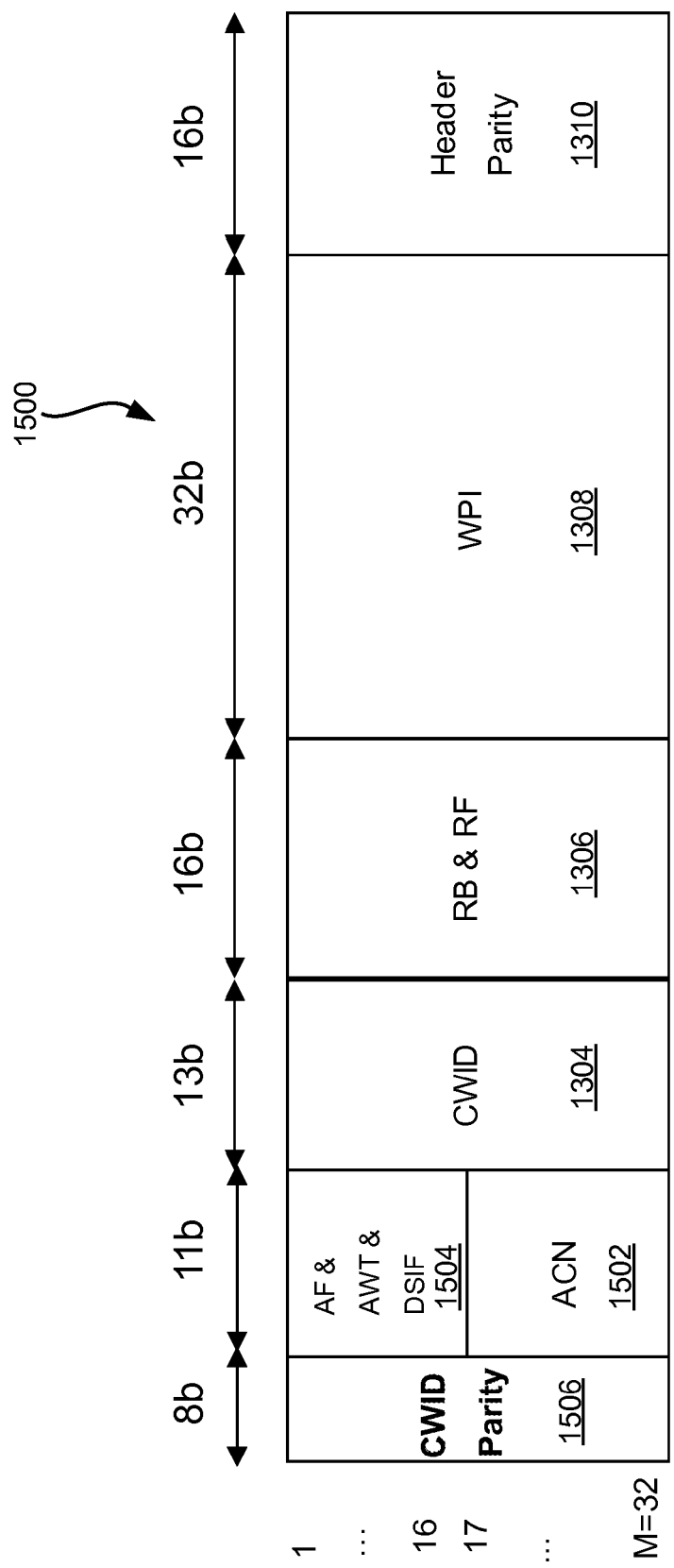
FIG. 15 shows a header format including CWID parity, according to another embodiment.

Now referring to FIG. 15, a header format 1500 which allows for CWID parity 1506 placement is shown according to one embodiment. Some fields in the header format 1500 are unchanged from the header format 1300 shown in FIG. 13, including the CWID field 1304, RB and RF fields 1306, WPI field 1308, and header parity field 1310.

However, as shown in FIG. 15, the header format 1500 has utilized some of the bits in the AF, AWT, and DSIF fields 1504, and the ACN field 1502, separately, to store the CWID parity 1506, and the CWID parity 1506 is stored in all tracks (M). As shown, the CWID parity 1506 is recorded in the first 8 bits on each track 1 to M of the CWI-4 set, but may instead be stored after or before any other fields in the CWI-4 set, or even distributed across one or more of the fields in each track. Furthermore, when M=32, it is shown that the AF, AWT, and DSIF fields 1504 may be stored in the first 16 (M/2) tracks (tracks 1 to 16) as a block, while the ACN field 1502 is stored as a block in the last 16 (M/2) tracks (tracks 17 to M=32).

However, more or less tracks may be used by the ACN field 1502, which would affect the size of the AF, AWT, and DSIF fields 1504, as long as an acceptable amount of robustness is provided for each field. Furthermore, the AF, AWT, and DSIF fields 1504 and the ACN field 1502 may be distributed evenly or randomly across any or all tracks in the CWI-4 set, such as on even or odd numbered tracks, groups of tracks, etc.

The M/2 tracks (or more or less) storing the AF, AWT, and DSIF fields 1504 do not have to be adjacent, nor do the M/2 tracks (or more or less) storing the ACN field 1502 have to be adjacent, in various embodiments. They may be located in any order in the group of M tracks.

The CWID parity field 1506 which protects the M=32 CWIDs within a CWI-4 set may be stored in 8 bit×32 tracks, according to one embodiment. This allows for improved performance in the presence of dead tracks, with cross-track header interpolation across 16 tracks being useful to decode the AF, AWT, and DSIF fields 1504 and the ACN field 1502. However, this means that decoding the header associated with one CWI-4 requires the availability of other CWI-4 headers. Therefore, cross-track header interpolation based on a single group of M/2 (16) tracks (not 2×8) provides the best performance.

In some embodiments, additional header protection may be achieved by extending C1 codewords (similar to the header protection concept implemented in some header formats) by embedding header bytes of critical importance, such as header CRC (header parity) and CWID, into C1 codewords.

As an example of this additional header protection scheme, assume that two Header Parity (CRC) bytes (header bytes 10 and 11) and two bytes of 13-bit CWID including three ACN bits (header bytes 2 and 3) are embedded into four C1 codewords resulting in a one-byte extension of all four C1 codewords. This 1-byte provides C1 error performance with 1-byte extension of C1 codewords in a CWI-4 that is almost the same as C1 error performance prior to changes to the header format to include CWID parity.

However, this scheme also provides for two-fold CWID protection (from the C1 code and CWID parity). In order to achieve this during decoding, data undergoes C1 decoding and then errors in the CWID and header CRC are corrected, followed by CWID decoding when all header errors have not been corrected. This scheme provides additional protection of two header CRC bytes.

TABLE 1

| | Header Format 1400 | Header Format 1500 |
|---|---|---|
| M = # of channels | 32 | 32 |
| L = # of CWID parity tracks | 16 | 32 |
| S = RS symbol size in bits | 8 | 8 |
| N = RS codeword size in symbols | 96 | 96 |
| K = RS payload size in symbols | 64 | 64 |
| T = Max. # of correctable symbols in N-symbol codeword | 16 | 16 |
| Td = Max. # of correctable symbols in N-symbol codeword in the presence of 4 dead tracks | 8*-12** | 10 |

Table 1 shows a comparison between the two header formats described in FIGS. 14 and 15 with a first set of parameters. For exemplary purposes, both header formats in the first case utilize 32 tracks or channels, 96-symbol RS codeword size, and 64-symbol RS payloads. However, header format 1400 relies on 16 CWID parity tracks, while header format 1500 relies on 32 CWID parity tracks. Both header formats are capable of correcting up to 16 symbols in an N-symbol codeword where the symbol size is 8 bits. Header format 1400 may correct in a best scenario (where errors are spread across tracks in the best possible way) 12 errors in the presence of 4 dead tracks (this case is denoted by superscript ** in Table 1), and may correct 8 errors in the presence of four dead tracks in a worst scenario (this case is denoted by superscript * in Table 1). Header format 1500 can correct 10 errors in all scenarios in the presence of four dead tracks.

TABLE 2

| | Header Format 1400 | Header Format 1500 |
|---|---|---|
| M = # of channels | 32 | 32 |
| L = # of CWID parity tracks | 12 | 32 |
| S = RS symbol size in bits | 8 | 8 |
| N = RS codeword size in symbols | 88 | 96 |
| K = RS payload size in symbols | 64 | 64 |
| T = Max. # of correctable symbols in N-symbol codeword | 12 | 16 |
| Td = Max. # of correctable symbols in N-symbol codeword in the presence of 4 dead tracks | 4*-8** | 10 |

Table 2 shows another comparison between the two header formats described in FIGS. 14 and 15 with a second set of parameters. For exemplary purposes, in the second case, both header formats utilized 32 tracks or channels, 8-bit RS symbol size, and 64-symbol RS payloads. However, header format 1400 relies on 12 CWID parity tracks, while header format 1500 relies on 32 CWID parity tracks. Header format 1400 is capable of correcting up to 12 symbols in an N-symbol codeword, may correct in a best scenario (where errors are spread across tracks in the best possible way) 8 errors in the presence of 4 dead tracks (this case is denoted by superscript ** in Table 2), and may correct 4 errors in a worst scenario (this case is denoted by superscript * in Table 2). Header format 1500 is capable of correcting up to 16 symbols in an N-symbol codeword, and can correct 10 errors in all scenarios in the presence of four dead tracks. Therefore, header format 1500 provides better protection of CWID fields than header format 1400 in Table 2. Header format 1400 in Table 2, however, provides stronger protection of the repeated fields AF, AWT, DSIF and ACN as they are stored on 20 tracks while the repeated fields AF, AWT, DSIF and ACN are stored on 16 tracks in header format 1500.

Figure 16:
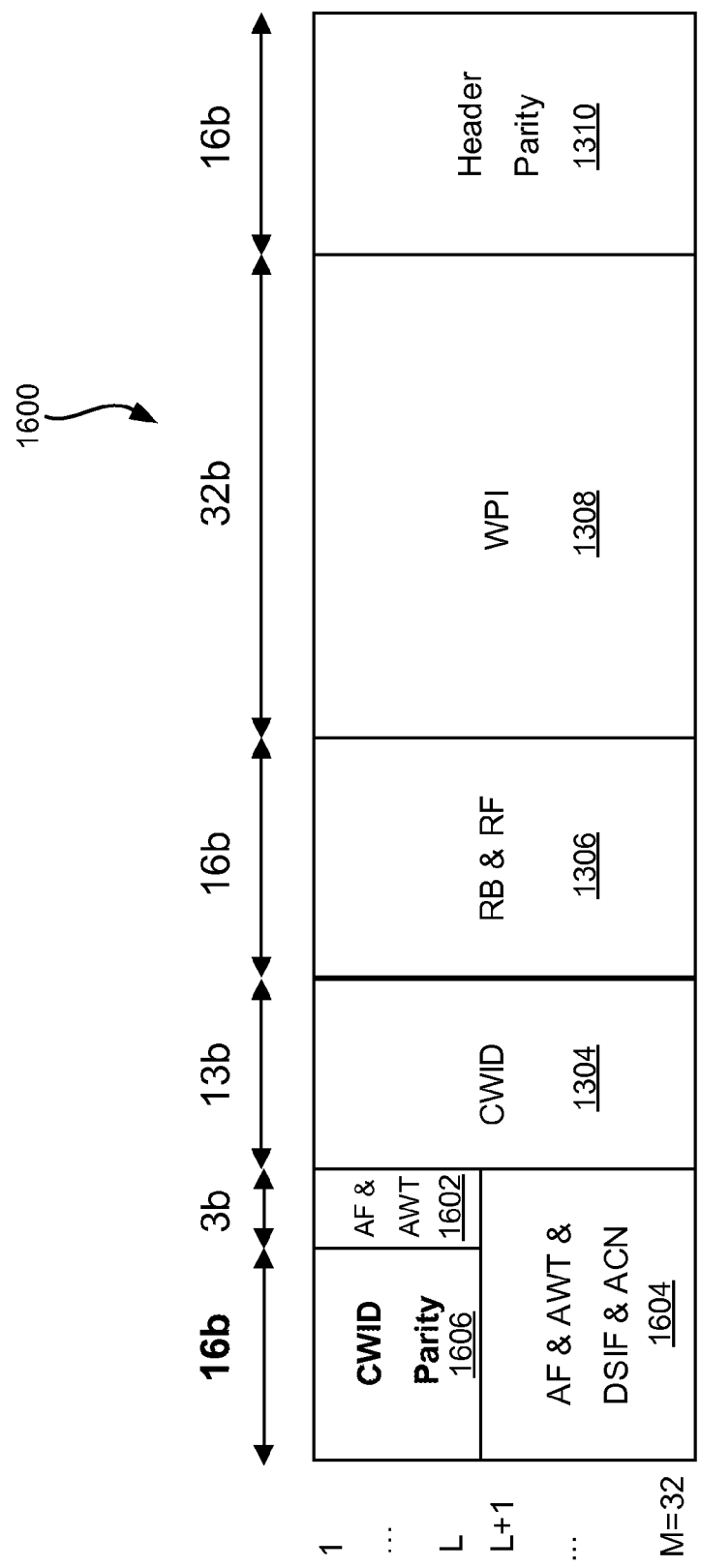
FIG. 16 shows another header format including CWID parity, according to one embodiment.

With reference to FIG. 16, another header format 1600 is shown according to one embodiment where some of the bits in the DSIF and ACN fields are utilized for storing the CWID parity 1606. As shown, the CWID parity 1606 is recorded in the first 16 bits and the AF and AWT fields 1602 are stored in the next 3 bits on each track 1 to L of the CWI-4 set, but may instead be stored after or before any other fields in the CWI-4 set, or even distributed across one or more of the fields in each of the L tracks.

Furthermore, the L tracks (such as M/2=16 tracks or more or less) storing the CWID parity 1606 and AF and AWT fields 1602 do not have to be adjacent, nor do the M−L tracks (or more or less) storing the DSIF, ACN, and remaining bits of the AF and AWT fields 1604 have to be adjacent, in various embodiments. They may be located in any order in the group of M tracks.

In various approaches, L may be more or less than half of M, such as 16 when M=32. This allows the size of the CWID parity field 1606 to be increased or decreased to provide more or less protection to the CWIDs which would affect the size of the DSIF and ACN fields in 1604, as long as an acceptable amount of robustness is provided for each field.

In the header format 1600 shown in FIG. 16, according to one embodiment, the AF and AWT fields are stored on all M tracks (e.g., 16, 32, 64, etc.), two-symbol CWID parity 1606 is stored on L tracks and the symbol size of the RS code is 8 bits, the DSIF and ACN fields (along with AF and AWT fields) 1604 are stored on M−L tracks, and 13-bit CWIDs (rows in 1304) are mapped into two (8-bit) symbols with three virtual bits (which are not physically stored on tape) for RS encoding to produce the 16-bit CWID parity symbols in CWID parity 1606. These virtual bits may be zeros, ones, or some known combination thereof so that during decoding they can be assumed to be known. Furthermore, cross-track header interpolation based on a single group of M−L tracks provides best performance, in one approach.

Figure 17:
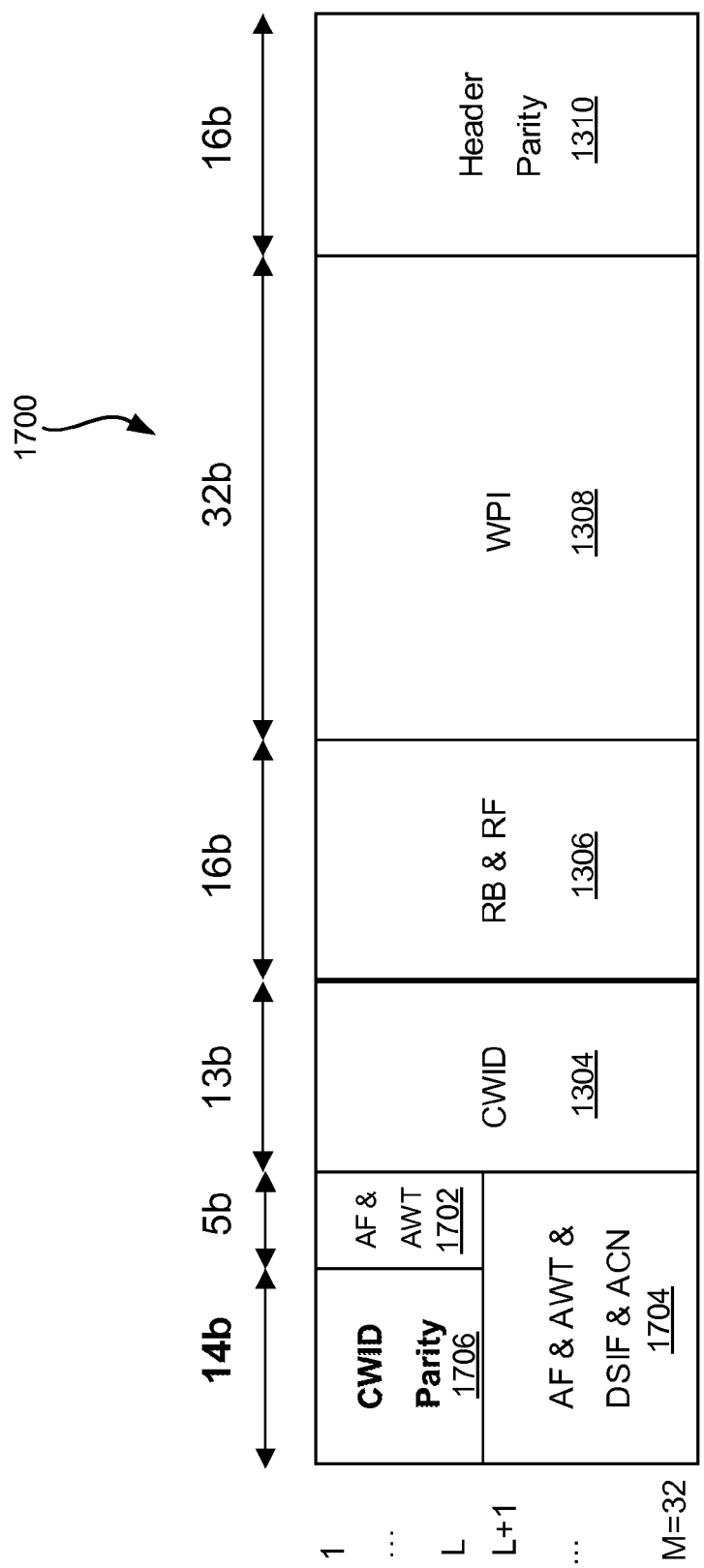
FIG. 17 shows a header format including CWID parity, according to another embodiment.

Now referring to FIG. 17, a header format 1700 is shown according to another embodiment where some of the bits in the DSIF and ACN fields are utilized for storing the CWID parity 1706. As shown, the CWID parity 1706 is recorded in the first 14 bits and the AF and AWT fields 1702 are stored in the next 5 bits on each track 1 to L of the CWI-4 set, but may instead be stored after or before any other fields in the CWI-4 set, or even distributed across one or more of the fields in each of the L tracks.

Furthermore, the L tracks (such as M/2=16 tracks or more or less) storing the CWID parity 1706 and AF and AWT fields 1702 do not have to be adjacent, nor do the M−L tracks (or more or less) storing the DSIF, ACN, AF and AWT fields 1704 have to be adjacent, in various embodiments. They may be located in any order in the group of M tracks.

In various approaches, L may be more or less than half of M, such as 16 when M=32. This allows the size of the CWID parity field 1706 to be increased or decreased to provide more or less protection to the CWIDs which would affect the size of the AF, AWT, DSIF, and ACN fields 1704, as long as an acceptable amount of robustness is provided for each field.

In the header format 1700 shown in FIG. 17, according to one embodiment, the AF and AWT fields are stored on all M tracks (e.g., 16, 32, 64, etc.), two-symbol CWID parity 1706 is stored on L tracks and the symbol size of the RS code is 7 bits, the DSIF and ACN fields (along with remaining AF and AWT fields) 1704 are stored on M−L tracks, and 13-bit CWIDs are mapped into two (7-bit) symbols with one virtual bit (which is not physically stored on tape) for RS encoding to produce the 14-bit CWID parity symbols in CWID parity 1706. This virtual bit is not actually stored to tape and may be a zero or a one, as long as it is known so that during decoding it can be assumed to be known.

Furthermore, cross-track header interpolation based on a single group of M−L tracks provides best performance, in one approach.

TABLE 3

| | Header Format 1600 | Header Format 1700 |
|---|---|---|
| M = # of channels | 32 | 32 |
| L = # of CWID parity tracks | 16 | 16 |
| S = RS symbol size in bits | 8 | 7 |
| N = RS codeword size in symbols | 96 | 96 |
| K = RS payload size in symbols | 64 | 64 |
| T = Max. # of correctable symbols in N-symbol codeword | 16 | 16 |
| Td = Max. # of correctable symbols in N-symbol codeword in the presence of 4 dead tracks | 8*-12** | 8*-12** |

Table 3 shows a comparison between the two header formats described in FIGS. 16 and 17 with the first set of parameters. For exemplary purposes, both header formats in the first case utilize 32 tracks or channels, 16 CWID parity tracks, 96-symbol RS codeword size, and 64-symbol RS payloads. However, header format 1600 relies on an 8-bit RS symbol, while header format 1700 relies on a 7-bit RS symbol. Both header formats are capable of correcting up to 16 symbols in an N-symbol codeword, may correct in a best scenario (where errors are spread across tracks in the best possible way) 12 errors in the presence of 4 dead tracks, and may correct 8 errors in the presence of four dead tracks in a worst scenario. If there are too many uncorrectables in a CWI-4 during read, e.g., 3 or more uncorrectables, CWID and CWID parity associated with that CWI-4 is erased.

TABLE 4

| | Header Format 1600 | Header Format 1700 |
|---|---|---|
| M = # of channels | 32 | 32 |
| L = # of CWID parity tracks | 12 | 12 |
| S = RS symbol size in bits | 8 | 7 |
| N = RS codeword size in symbols | 88 | 88 |
| K = RS payload size in symbols | 64 | 64 |
| T = Max. # of correctable symbols in N-symbol codeword | 12 | 12 |
| Td = Max. # of correctable symbols in N-symbol codeword in the presence of 4 dead tracks | 4*-8** | 4*-8** |

Table 4 shows another comparison between the two header formats described in FIGS. 16 and 17 with a second set of parameters. For exemplary purposes, in the second case, both header formats utilized 32 tracks or channels, 12 CWID parity tracks, 88-symbol RS codeword size, and 64-symbol RS payloads. However, header format 1600 relies on an 8-bit RS symbol, while header format 1700 relies on a 7-bit RS symbol. Both header formats are capable of correcting up to 12 symbols in an N-symbol codeword, may correct in a best scenario (where errors are spread across tracks in the best possible way) 8 errors in the presence of 4 dead tracks, and may correct 4 errors in a worst scenario. If there are too many uncorrectables in a CWI-4 during read, e.g., 3 or more uncorrectables, CWID and CWID parity associated with that CWI-4 is erased.

Figure 18:
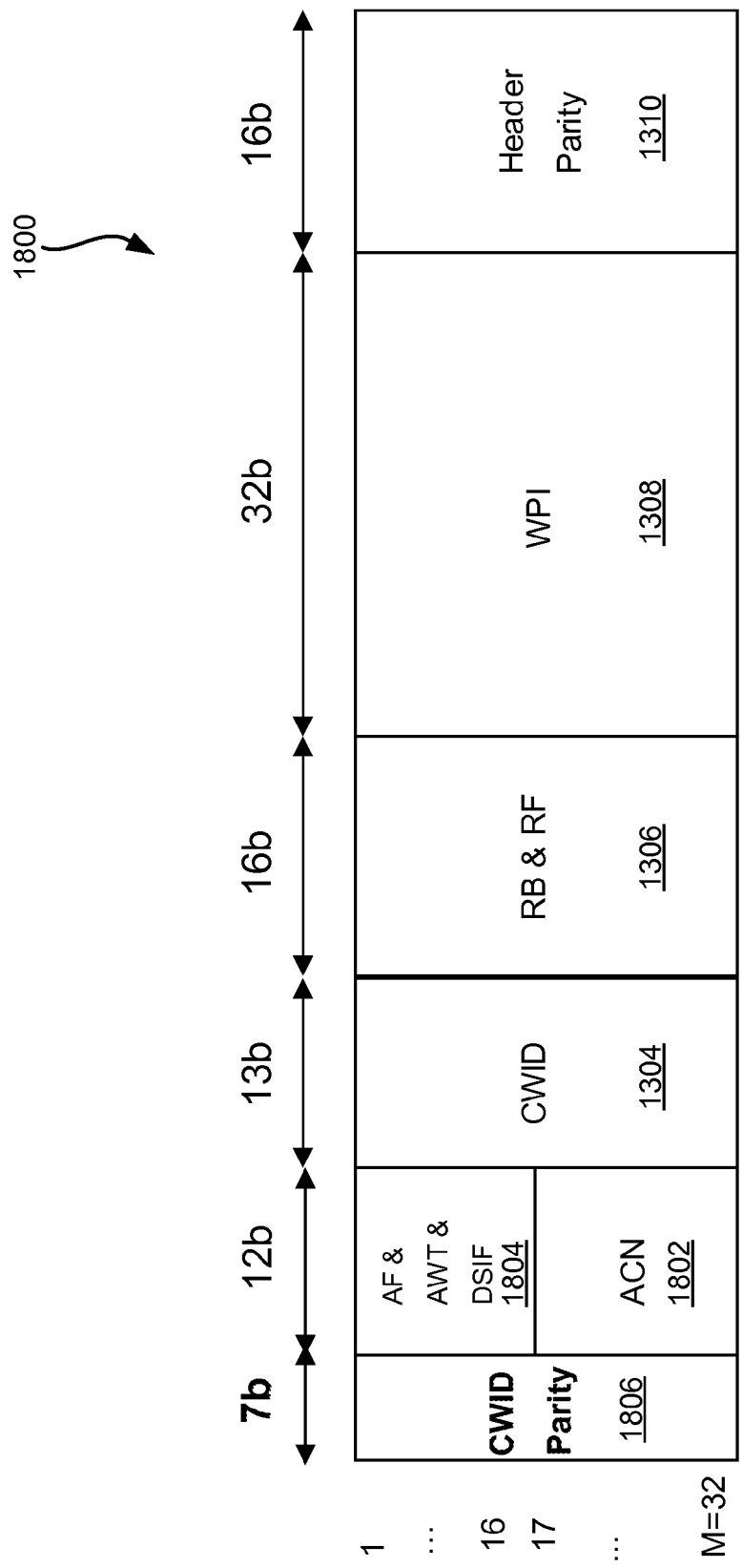
FIG. 18 shows another header format including CWID parity, according to one embodiment.

Now referring to FIG. 18, a header format 1800 which allows for CWID parity 1806 placement is shown according to one embodiment. Some fields in the header format 1800 are unchanged from the header format 1300 shown in FIG. 13, including the CWID field 1304, RB and RF fields 1306, WPI field 1308, and header parity field 1310.

However, as shown in FIG. 18, the header format 1800 has utilized some of the bits in the AF, AWT, and DSIF fields 1804, and the ACN field 1802, separately, to store the CWID parity 1806. As shown, the CWID parity 1806 is recorded in the first 7 bits on each track 1 to M of the CWI-4 set, but may instead be stored after or before any other fields in the CWI-4 set, or even distributed across one or more of the fields in each track. Furthermore, when M=32, it is shown that the AF, AWT, and DSIF fields 1804 may be stored in the first 16 (M/2) tracks (tracks 1 to 16) as a block, while the ACN field 1802 is stored as a block in the last 16 (M/2) tracks (tracks 17 to M). However, more or less tracks may be used by the ACN field 1802, which would affect the size of the AF, AWT, and DSIF fields 1804, as long as an acceptable amount of robustness is provided for each field. Furthermore, the AF, AWT, and DSIF fields 1804 and the ACN field 1802 may be distributed evenly or randomly across any or all tracks in the CWI-4 set, such as on even or odd numbered tracks, groups of tracks, etc.

The M/2 tracks (or more or less) storing the AF, AWT, and DSIF fields 1804 do not have to be adjacent, nor do the M/2 tracks (or more or less) storing the ACN field 1802 have to be adjacent, in various embodiments. They may be located in any order in the group of M tracks.

The CWID parity field 1806 which protects the M CWIDs within a CWI-4 set may be stored in 7 bits×32 tracks, according to one embodiment. In this case, 13-bit CWID is mapped into two symbols with one virtual bit which is not physically stored on tape included for RS encoding. This allows for improved performance in the presence of dead tracks, with cross-track header interpolation across 16 tracks being useful to decode the AF, AWT, and DSIF fields 1804 and the ACN field 1802. However, this means that decoding the header associated with one CWI-4 requires the availability of other CWI-4 headers. Therefore, cross-track header interpolation based on a single group of M/2 (16) tracks (not 2×8) provides the best performance.

TABLE 5

| | Header Format 1500 | Header Format 1800 |
|---|---|---|
| M = # of channels | 32 | 32 |
| L = # of CWID parity tracks | 32 | 32 |
| S = RS symbol size in bits | 8 | 7 |
| N = RS codeword size in symbols | 96 | 96 |
| K = RS payload size in symbols | 64 | 64 |
| T = Max. # of correctable symbols in N-symbol codeword | 16 | 16 |
| Td = Max. # of correctable symbols in N-symbol codeword in the presence of 4 dead tracks | 10 | 10 |

Table 5 shows a comparison between the two header formats described in FIGS. 15 and 18. For exemplary purposes, both header formats in the first case utilize 32 tracks or channels, 32 CWID parity tracks, 96-symbol RS codeword size, and 64-symbol RS payloads. However, header format 1500 relies on an 8-bit RS symbol, while header format 1800 relies on a 7-bit RS symbol. Both header formats are capable of correcting up to 16 symbols in an N-symbol codeword, may correct 10 errors in the presence of 4 dead tracks regardless of the scenario. If there are too many C1 uncorrectables in a CWI-4 during read, e.g., 3 or more C1 uncorrectables, CWID and CWID parity associated with that CWI-4 is erased.

The header formats described herein according to various embodiments provide a very high degree of protection for CWID fields which is beneficial in order to obtain the best possible error-rate performance with iterative hard-decision C1/C2 decoding. Also, two-fold protection of the CWID fields when CWIDs are also embedded into the C1 codewords is possible, and the strong header protections do not use up the 15 reserved bits in the 12-byte headers. Moreover, format efficiency does not decrease as a result of the stronger header protection being deployed.

Figure 19:
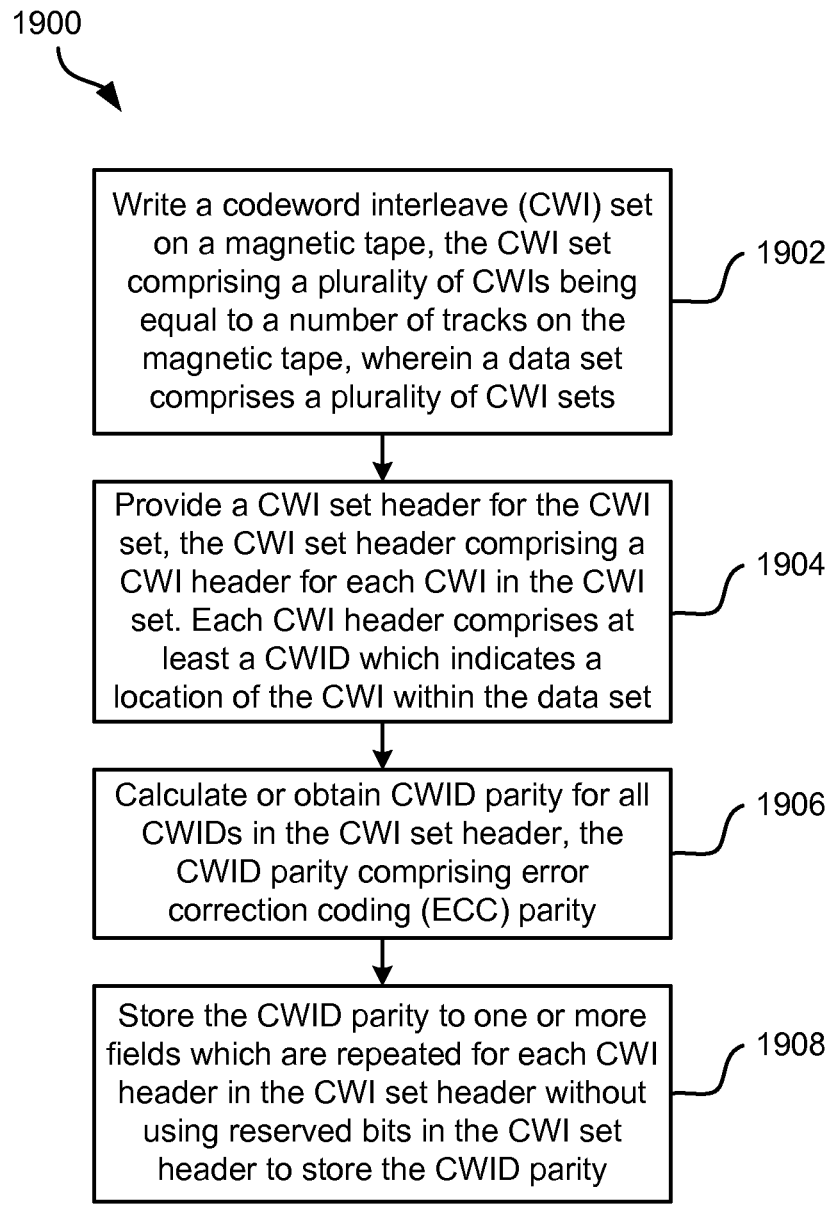
FIG. 19 is a flowchart of a method according to one embodiment.

Now referring to FIG. 19, a flowchart of a method 1900 for providing header protection in magnetic tape recording is shown according to one embodiment. The method 1900 may be executed in and/or with the use of any of the environments, systems, apparatuses, and/or schemes described in FIGS. 1-18, in various approaches. Furthermore, the method 1900 may include more or less operations than those specifically described with reference to FIG. 19.

In operation 1902, a codeword interleave (CWI) set is written on a magnetic tape. The CWI set comprises a plurality of CWIs being equal to a number of tracks on the magnetic tape (such as 16, 32, 64, etc.). Furthermore, a data set (DS) comprises a plurality of CWI sets, each CWI set being written simultaneously across all tracks of the magnetic tape in a predetermined arrangement. In one embodiment, a DS may comprise 192 CWI sets. Each CWI may comprise four interleaved C1 codewords (e.g., each CWI may be a CWI-4) or more or less codewords depending on the storage scheme.

In operation 1904, a CWI set header is provided for the CWI set, the CWI set header comprising a CWI header for each CWI in the CWI set. Each CWI header comprises at least a CWID which indicates a location of the CWI within the data set.

According to one embodiment, each CWI header may be 12 bytes in length (byte 0 to byte 11), and may include an amble flag (AF), an adjacent wrap toggle (AWT) field, and a data set identifier fragment (DSIF) stored in byte 0 (H0), an absolute codeword object set sequence number (ACN) stored in bytes 1 and 2 (H1 and H2), a CWID stored in bytes 2 and 3 (H2 and H3) and occupies 13 bits, reserved bits in bytes 4 and 5 (H4 and H5), a write pass identifier (WPI)

stored in bytes 6, 7, 8, and 9 (H6, H7, H8, and H9), and header parity stored in bytes 10 and 11 (HA and HB). Of course, other byte locations may be used to store each of the fields, as would be understood by one of skill in the art.

Furthermore, the CWIDs may each be 13 bits long and stored across all tracks of the magnetic tape in one embodiment. In other embodiments, more or less than 13 bits may be used to store the CWIDs.

In operation 1906, CWID parity for all CWIDs in the CWI set header is calculated or obtained. The CWID parity may be calculated according to any parity scheme known in the art, such as ECC, forward error correction (FEC), etc.

In operation 1908, the CWID parity is stored to one or more fields which are repeated for each CWI header in the CWI set header without using reserved bits (RB) in the CWI set header to store the CWID parity. In this embodiment, the CWID parity is stored to the magnetic tape without using or writing data to the reserved bits (RB) of the CWI headers, e.g., these RB are reserved for future use, as intended.

According to one embodiment, each CWI may be a CWI-4, and the CWI set may comprise a plurality of CWI-4s. Of course, any number of codewords may be interleaved into each CWI as would be understood by one of skill in the art.

In one embodiment, the one or more repeated fields which are used to store the CWID parity may comprise at least one of: AF, AWT, DSIF, and/or ACN fields. Since these fields are repeated for each CWI header, these values are still stored to the magnetic tape, just not repeated as many times due to the CWID parity being stored instead.

In one embodiment, the CWID parity may be stored as 8 bits on all tracks of a 32 track magnetic tape (possibly within the CWI headers), and bits allocated to one or more of the AF, AWT, DSIF, and ACN fields (or possibly all of these fields) on each track of the magnetic tape are reduced to accommodate the CWID parity. In effect, the AF, AWT, and DSIF are stored in 11 bits on 16 of the 32 tracks of the magnetic tape, and ACN is stored in 11 bits on another 16 tracks of the magnetic tape. For a 32-track magnetic tape, this results in 8 bits×32 tracks=256 bits of CWID parity.

In a further embodiment, the CWID parity may be stored as one symbol with a RS code symbol size of 8 bits. Furthermore, the 13-bit CWID may be mapped into two symbols with three virtual bits (that are not physically stored to the magnetic tape) for RS encoding according to this embodiment.

In another embodiment, the CWID parity may be stored as 19 bits on L of a total M tracks of the magnetic tape, where L<M. For example, L may equal 12 or 16 when M=32 such that the CWID parity is stored in 12 or 16 tracks of the magnetic tape. When M=32 and L=12, the CWID parity is stored in 19 bits×12 tracks=228 bits, and when M=32 and L=16, the CWID parity is stored in 19 bits×16 tracks=304 bits.

Furthermore, bits allocated to each of the AF, AWT, DSIF, and ACN fields in some or all of the tracks are reduced to accommodate the CWID parity, such that the AF, AWT, DSIF, and ACN fields are stored in 19 bits on another (different from the L tracks) M−L tracks of the magnetic tape. When M=32 and L=12, the AF, AWT, DSIF, and ACN fields are stored in 19 bits of 20 tracks of the magnetic tape, e.g., 19 bits×20 tracks=380 bits. When M=32 and L=16, the AF, AWT, DSIF, and ACN fields are stored in 19 bits on 16 tracks of the magnetic tape, e.g., 19 bits×16 tracks=304 bits.

In yet another embodiment, the CWID parity may be stored as 16 bits on L of a total M tracks of the magnetic tape, where L<M. For example, L may equal 12 or 16 when M=32 such that the CWID parity is stored on 12 tracks or 16 tracks of the 32-track magnetic tape. In this embodiment, when M=32 and L=12, the CWID parity is stored on 16 bits×12 tracks=192 bits, and when M=32 and L=16, the CWID parity is stored on 16 bits×16 tracks=256 bits.

AF, AWT, DSIF, and ACN may be stored on 19 bits of another M−L tracks of the magnetic tape, and AF and AWT may be stored on an additional 3 bits of the L tracks of the magnetic tape. Furthermore, bits allocated to each of the DSIF and ACN fields may be reduced to accommodate the CWID parity, while bits allocated to each of the AF and AWT fields may not be reduced or reduced by less of an amount. Therefore, when M=32, and L=12, the AF, AWT, DSIF, and ACN fields are stored in 19 bits on 20 tracks of the magnetic tape, e.g., 19 bits×20 tracks=380 bits with the AF and AWT fields occupying another 3 bits on 12 tracks of the magnetic tape, e.g., 3 bits×12 tracks=36 bits. When M=32 and L=16, the AF, AWT, DSIF, and ACN fields are stored in 19 bits on 16 tracks of the magnetic tape, e.g., 19 bits×16 tracks=304 bits with the AF and AWT fields occupying another 3 bits on 16 tracks of the magnetic tape, e.g., 3 bits×16 tracks=48 bits.

In this embodiment, a two symbol CWID parity may be stored on L tracks with a RS code symbol size of 8 bits. Furthermore, the 13-bit CWIDs may each be mapped into two symbols with three virtual bits, that are not physically stored to the magnetic tape, for RS encoding.

According to another embodiment, the CWID parity may be stored as 14 bits on L of a total M tracks of the magnetic tape, where L<M. For example, L may equal 12 or 16 when M=32 such that the CWID parity is stored on 12 tracks or 16 tracks of the magnetic tape. In this embodiment, when M=32 and L=12, the CWID parity is stored in 14 bits×12 tracks=168 bits, and when M=32 and L=16, the CWID parity is stored in 16 bits×16 tracks=224 bits.

AF, AWT, DSIF, and ACN may be stored in 19 bits of another M−L tracks of the magnetic tape, and AF and AWT may be stored in an additional 5 bits of the L tracks of the magnetic tape. Furthermore, bits allocated to each of the DSIF and ACN fields may be reduced to accommodate the CWID parity, while bits allocated to each of the AF and AWT fields may not be reduced or reduced by less of an amount. Therefore, when M=32, and L=12, the AF, AWT, DSIF, and ACN fields are stored in 19 bits on 20 tracks of the magnetic tape, e.g., 19 bits×20 tracks=380 bits with the AF and AWT fields occupying another 5 bits on 12 tracks of the magnetic tape, e.g., 5 bits×12 tracks=60 bits. When M=32 and L=16, the AF, AWT, DSIF, and ACN fields are stored in 19 bits on 16 tracks of the magnetic tape, e.g., 19 bits×16 tracks=304 bits with the AF and AWT fields occupying another 5 bits on 16 tracks of the magnetic tape, e.g., 5 bits×16 tracks=80 bits.

As another example for L=12, it is possible to increase the length of ACN and store only DSIF and ACN fields in 19 bits on 20 tracks of the magnetic tape, e.g., 19 bits×20 tracks=380 bits, with the AF and AWT fields occupying another 5 bits on 12 tracks of the magnetic tape, e.g., 5 bits×12 tracks=60 bits. Similarly for L=16, it is possible to increase the length of ACN and store only DSIF and ACN fields in 19 bits on 16 tracks of the magnetic tape, e.g., 16 bits×20 tracks=304 bits, with the AF and AWT fields occupying another 5 bits on 16 tracks of the magnetic tape, e.g., 5 bits×16 tracks=80 bits.

In this embodiment, a two symbol CWID parity may be stored on L tracks with a RS code symbol size of 7 bits. Furthermore, the 13-bit CWIDs may be mapped into two symbols with one virtual bit, that is not physically stored to the magnetic tape, for RS encoding.

In another embodiment, the CWID parity may be stored as 7 bits on each track of the magnetic tape (possibly within the CWI header), and bits allocated to each of the AF, AWT, and DSIF fields, and the ACN field in each track of the magnetic tape may be reduced, separately, to accommodate the CWID parity. For a 32-track magnetic tape, this results in 7 bits×32 tracks=224 bits of CWID parity. Furthermore, the AF, AWT, and DSIF fields may be stored on L tracks of the magnetic tape having a total of M tracks, where L<M, and the ACN field may be stored on another M−L tracks of the magnetic tape.

For example, when M=32 and L=12, the AF, AWT, and DSIF fields may be stored on 12 bits×12 tracks=144 bits, while the ACN field may be stored on 12 bits×20 tracks=240 bits. In another example, when M=32 and L=16, the AF, AWT, and DSIF fields may be stored on 12 bits×16 tracks=192 bits, while the ACN field may be stored on 12 bits×16 tracks=192 bits.

In this embodiment, a one symbol CWID parity may be stored on all tracks with a RS code symbol size of 7 bits. Furthermore, the 13-bit CWIDs may be mapped into two symbols with one virtual bit, that is not physically stored to the magnetic tape, for RS encoding according to this embodiment.

The method 1900 may be executed in a system, apparatus, computer program product, or in any other way known in the art. In one such embodiment, a system (such as a tape drive subsystem) may include a processor (such as a CPU, ASIC, FPGA, etc.) and modules (such as an ECC encoder, a multiplexer, etc.), code, and/or logic (soft or hard) integrated with and/or executable by the processor to execute the steps of the method 1900 or portions thereof. In another embodiment, a computer program product may include a computer readable storage medium having program code embodied therewith, the program code readable/executable by a tape drive to execute the method 1900 or portions thereof.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A computer program product for providing header protection in magnetic tape recording, the computer program product comprising a non-transitory computer readable storage medium having program instructions embodied therewith, the program instructions readable by a processor to cause the processor to:
   calculate or obtain, by the processor, codeword interleave designation (CWID) parity for all CWIDs in a codeword interleave (CWI) set header, the CWID parity comprising error correction coding (ECC) parity; and
   store, by the processor, the CWID parity to a magnetic tape in one or more fields which are repeated for each CWI header in the CWI set header without using reserved bits in the CWI set header to store the CWID parity.

2. The computer program product as recited in claim 1, wherein the program instructions are further readable by the processor to:
   write, by the processor, a CWI set on the magnetic tape, the CWI set comprising a plurality of CWIs being equal to a number of tracks on the magnetic tape, wherein a data set comprises a plurality of CWI sets; and
   provide, by the processor, the CWI set header for the CWI set, the CWI set header comprising a CWI header for each CWI in the CWI set, each CWI header comprising at least a CWI Designation (CWID) which indicates a location of the CWI within the data set.

3. The computer program product as recited in claim 2, wherein each CWI header is 12 bytes in length (byte 0 to byte 11), and wherein each CWI header comprises:
   an amble flag (AF), an adjacent wrap toggle (AWT) field, and a data set identifier fragment (DSIF) stored in byte 0 (H0);
   an absolute codeword object set sequence number (ACN) stored in bytes 1 and 2 (H1 and H2);
   a CWID stored in bytes 2 and 3 (H2 and H3);
   reserved bits in bytes 4 and 5 (H4 and H5);
   a write pass identifier (WPI) stored in bytes 6, 7, 8, and 9 (H6, H7, H8, and H9); and
   header parity stored in bytes 10 and 11 (HA and HB).

4. The computer program product as recited in claim 3, wherein the one or more repeated fields which are used to store the CWID parity comprise at least one of: AF, AWT, DSIF, and ACN.

5. The computer program product as recited in claim 4, wherein the magnetic tape has 32 tracks, wherein the CWID parity is stored as 8 bits on all 32 tracks of the magnetic tape, wherein the AF, AWT, and DSIF are stored in 11 bits on 16 of the 32 tracks of the magnetic tape, and wherein ACN is stored in 11 bits on another 16 tracks of the magnetic tape.

6. The computer program product as recited in claim 5, wherein the CWID parity is stored as one symbol having a Reed-Solomon (RS) code symbol size of 8 bits, and wherein the CWIDs occupy 13 bits on each track of the magnetic tape and are mapped into two symbols with three virtual bits for RS encoding.

7. The computer program product as recited in claim 4, wherein the CWID parity is stored as 19 bits on L of a total M tracks of the magnetic tape, wherein L<M, and wherein the AF, AWT, DSIF, and ACN are stored on another M-L tracks of the magnetic tape.

8. The computer program product as recited in claim 4, wherein the CWID parity is stored as 16 bits on L of a total M tracks of the magnetic tape, wherein L<M, wherein the AF, AWT, DSIF, and ACN are stored on 19 bits of another M-L tracks of the magnetic tape, and wherein AF and AWT are stored on an additional 3 bits of the L tracks of the magnetic tape.

9. The computer program product as recited in claim 8, wherein the CWID parity is stored as two symbols having a Reed-Solomon (RS) code symbol size of 8 bits, and wherein the CWIDs occupy 13 bits of each track of the magnetic tape and are mapped into two symbols with three virtual bits for RS encoding.

10. The computer program product as recited in claim 4, wherein the CWID parity is stored as 14 bits on L of a total M tracks of the magnetic tape, wherein L<M, wherein the AF, AWT, DSIF, and ACN are stored on 19 bits of another M-L tracks of the magnetic tape, and wherein AF and AWT are stored on an additional 5 bits of the L tracks of the magnetic tape.

11. The computer program product as recited in claim 10, wherein the CWID parity is stored as two symbols having a Reed-Solomon (RS) code symbol size of 7 bits, and wherein the CWIDs occupy 13 bits of each track of the magnetic tape and are mapped into two symbols with one virtual bit for RS encoding.

12. The computer program product as recited in claim 4, wherein the CWID parity is stored as 7 bits on each track of the magnetic tape, wherein the AF, AWT, and DSIF are stored on 12 bits of L of a total M tracks of the magnetic tape, wherein L<M, and wherein ACN is stored in 12 bits of another M-L tracks of the magnetic tape, and wherein the CWID parity is stored as one symbol having a Reed-Solomon (RS) code symbol size of 7 bits, and wherein the CWIDs occupy 13 bits of each track of the magnetic tape and are mapped into two symbols with one virtual bit for RS encoding.

13. A system for providing header protection in magnetic tape recording, the system comprising a processor and logic integrated with and/or executable by the processor, the logic being configured to:
   calculate or obtain codeword interleave designation (CWID) parity for all CWIDs in a codeword interleave (CWI) set header, the CWID parity comprising error correction coding (ECC) parity; and
   store the CWID parity to a magnetic tape in one or more fields which are repeated for each CWI header in the CWI set header without using reserved bits in the CWI set header to store the CWID parity.

14. The system as recited in claim 13, wherein the logic is further configured to:
   write a CWI set on the magnetic tape, the CWI set comprising a plurality of CWIs being equal to a number of tracks on the magnetic tape, wherein a data set comprises a plurality of CWI sets; and
   provide the CWI set header for the CWI set, the CWI set header comprising a CWI header for each CWI in the CWI set, each CWI header comprising at least a CWI Designation (CWID) which indicates a location of the CWI within the data set,
   wherein each CWI header is 12 bytes in length (byte 0 to byte 11), and wherein each CWI header comprises:
      an amble flag (AF), an adjacent wrap toggle (AWT) field, and a data set identifier fragment (DSIF) stored in byte 0 (H0);
      an absolute codeword object set sequence number (ACN) stored in bytes 1 and 2 (H1 and H2);
      a CWID stored in bytes 2 and 3 (H2 and H3);
      reserved bits in bytes 4 and 5 (H4 and H5);
      a write pass identifier (WPI) stored in bytes 6, 7, 8, and 9 (H6, H7, H8, and H9); and
      header parity stored in bytes 10 and 11 (HA and HB),
   wherein the one or more repeated fields which are used to store the CWID parity comprise at least one of: AF, AWT, DSIF, and ACN.

15. The system as recited in claim 14, wherein the magnetic tape has 32 tracks and the CWID parity is stored as 8 bits on all 32 tracks of the magnetic tape, the AF, AWT, and DSIF are stored in 11 bits on 16 of the 32 tracks of the magnetic tape, and ACN is stored in 11 bits on another 16 tracks of the magnetic tape; or wherein the CWID parity is stored as 19 bits on L of a total M tracks of the magnetic tape, the AF, AWT, DSIF, and ACN are stored on another M-L tracks of the magnetic tape, and M=32 and L=12 or 16.

16. The system as recited in claim 14, wherein the CWID parity is stored as 16 bits on L of a total M tracks of the magnetic tape, wherein L<M, wherein the AF, AWT, DSIF, and ACN are stored on 19 bits of another M-L tracks of the magnetic tape, wherein AF and AWT are stored on an additional 3 bits of the L tracks of the magnetic tape, wherein M=32 and L=12 or 16, wherein the CWID parity is stored as two symbols having a Reed-Solomon (RS) code symbol size of 8 bits, and wherein the CWIDs occupy 13 bits of each track of the magnetic tape and are mapped into two symbols with three virtual bits for RS encoding.

17. The system as recited in claim 14, wherein the CWID parity is stored as 14 bits on L of a total M tracks of the magnetic tape, wherein L<M, wherein the AF, AWT, DSIF, and ACN are stored on 19 bits of another M-L tracks of the magnetic tape, wherein AF and AWT are stored on an additional 5 bits of the L tracks of the magnetic tape, wherein M=32 and L=12 or 16, wherein the CWID parity is stored as two symbols having a Reed-Solomon (RS) code symbol size of 7 bits, and wherein the CWIDs occupy 13 bits of each track of the magnetic tape and are mapped into two symbols with one virtual bit for RS encoding.

18. The system as recited in claim 14, wherein the CWID parity is stored as 7 bits on each track of the magnetic tape, wherein the AF, AWT, and DSIF are stored on 12 bits of L of a total M tracks of the magnetic tape, wherein L<M, wherein ACN is stored on 12 bits of another M-L tracks of the magnetic tape, wherein the CWID parity is stored as one symbol having a Reed-Solomon (RS) code symbol size of 7 bits, and wherein the CWIDs occupy 13 bits of each track of the magnetic tape and are mapped into two symbols with one virtual bit for RS encoding.

19. A method for providing header protection in magnetic tape recording, the method comprising:
   calculating or obtaining codeword interleave designation (CWID) parity for all CWIDs in a codeword interleave (CWI) set header, the CWID parity comprising error correction coding (ECC) parity; and
   storing the CWID parity to a magnetic tape in one or more fields which are repeated for each CWI header in the CWI set header without using reserved bits in the CWI set header to store the CWID parity.

20. The method as recited in claim 19, comprising:
   writing a CWI set on the magnetic tape, the CWI set comprising a plurality of CWIs being equal to a number of tracks on the magnetic tape, wherein a data set comprises a plurality of CWI sets; and
   providing the CWI set header for the CWI set, the CWI set header comprising a CWI header for each CWI in the CWI set, each CWI header comprising at least a CWI Designation (CWID) which indicates a location of the CWI within the data set.

* * * * *